United States Patent
Iijima et al.

(10) Patent No.: US 9,166,531 B2
(45) Date of Patent: Oct. 20, 2015

(54) SEMICONDUCTOR INTEGRATED CIRCUIT DEVICE AND HIGH-FREQUENCY POWER AMPLIFIER MODULE

(71) Applicant: Murata Manufacturing Co., Ltd., Kyoto (JP)

(72) Inventors: Masanori Iijima, Kyoto (JP); Fuminori Morisawa, Kyoto (JP)

(73) Assignee: MURATA MANUFACTURING CO., LTD., Kyoto (JP)

( * ) Notice: Subject to any disclaimer, the term of this patent is extended or adjusted under 35 U.S.C. 154(b) by 0 days.

(21) Appl. No.: 14/366,719

(22) PCT Filed: Dec. 5, 2012

(86) PCT No.: PCT/JP2012/081532
§ 371 (c)(1),
(2) Date: Jul. 28, 2014

(87) PCT Pub. No.: WO2013/094415
PCT Pub. Date: Jun. 27, 2013

(65) Prior Publication Data
US 2014/0347130 A1  Nov. 27, 2014

(30) Foreign Application Priority Data

Dec. 20, 2011  (JP) .................................. 2011-277875

(51) Int. Cl.
*H03F 3/04*  (2006.01)
*G05F 1/10*  (2006.01)
(Continued)

(52) U.S. Cl.
CPC ............ *H03F 1/0233* (2013.01); *H03F 1/0261* (2013.01); *H03F 1/302* (2013.01);
(Continued)

(58) Field of Classification Search
USPC ............ 330/296, 288; 327/543, 306; 323/314
IPC .................... H03F 3/04; G05F 1/10; H05F 3/16
See application file for complete search history.

(56) References Cited

U.S. PATENT DOCUMENTS 4,851,831 A * 7/1989 Stern ........................ 340/870.16
5,467,052 A   11/1995 Tsukada
(Continued)

FOREIGN PATENT DOCUMENTS

JP   07-044255 A   2/1995
JP   09-219629 A   8/1997
(Continued)

OTHER PUBLICATIONS

International Search Report issued in Application No. PCT/JP2012/081532 dated Mar. 12, 2013.
(Continued)

*Primary Examiner* — Patricia T Nguyen
(74) *Attorney, Agent, or Firm* — Pearne & Gordon LLP

(57) ABSTRACT

The invention provides a semiconductor integrated circuit device and a high-frequency power amplifier module capable of reducing variations in the transmission power characteristics. The semiconductor integrated circuit device and the high-frequency power amplifier module each include, for example, a bandgap reference circuit, a regulator circuit, and a reference-voltage correction circuit which is provided between the bandgap reference circuit and the regulator circuit and which includes a unity gain buffer. The reference-voltage correction circuit corrects variations in a bandgap voltage from the bandgap reference circuit. The reference-voltage correction circuit includes first to third resistance paths having mutually different resistance values, and corrects the variations by selectively supplying a current which reflects an output voltage of the unity gain buffer to any one of the first to third resistance paths. The selection in this case is performed by connecting a bonding wire to any one of the terminals REF1 to REF3.

18 Claims, 19 Drawing Sheets

(51) Int. Cl.
    *H03F 1/02*      (2006.01)
    *H03F 1/30*      (2006.01)
    *H03F 1/56*      (2006.01)
    *H03F 3/195*     (2006.01)
    *H03F 3/24*      (2006.01)
    *H03F 3/45*      (2006.01)
    *H03F 3/72*      (2006.01)
    *H03G 1/00*      (2006.01)
    *H03F 3/193*     (2006.01)
    *H03F 3/213*     (2006.01)

(52) U.S. Cl.
    CPC .............. *H03F 1/56* (2013.01); *H03F 3/193* (2013.01); *H03F 3/195* (2013.01); *H03F 3/213* (2013.01); *H03F 3/245* (2013.01); *H03F 3/45071* (2013.01); *H03F 3/45183* (2013.01); *H03F 3/45475* (2013.01); *H03F 3/72* (2013.01); *H03G 1/0088* (2013.01); *H03F 2003/45017* (2013.01); *H03F 2200/111* (2013.01); *H03F 2200/222* (2013.01); *H03F 2200/27* (2013.01); *H03F 2200/387* (2013.01); *H03F 2200/411* (2013.01); *H03F 2200/429* (2013.01); *H03F 2200/528* (2013.01); *H03F 2200/78* (2013.01); *H03F 2203/45112* (2013.01); *H03F 2203/45398* (2013.01); *H03F 2203/45528* (2013.01); *H03F 2203/45542* (2013.01); *H03F 2203/45594* (2013.01); *H03F 2203/45601* (2013.01); *H03F 2203/45622* (2013.01); *H03F 2203/45674* (2013.01); *H03F 2203/45726* (2013.01); *H03F 2203/7206* (2013.01); *H03F 2203/7209* (2013.01); *H03F 2203/7236* (2013.01)

(56) References Cited

U.S. PATENT DOCUMENTS

| | | | | |
|---|---|---|---|---|
| 5,612,613 | A * | 3/1997 | Dutt et al. | 323/314 |
| 8,102,201 | B2 * | 1/2012 | Marinca | 327/539 |
| 8,842,225 | B2 * | 9/2014 | Murakami et al. | 348/730 |
| 2008/0238400 | A1 * | 10/2008 | Dobkin | 323/313 |
| 2013/0328615 | A1 * | 12/2013 | Sano et al. | 327/513 |

FOREIGN PATENT DOCUMENTS

| | | |
|---|---|---|
| JP | 2003-017954 A | 1/2003 |
| JP | 2004-013359 A | 1/2004 |
| JP | 2009-218996 A | 9/2009 |

OTHER PUBLICATIONS

Written Opinion issued in Application No. PCT/JP2012/081532 dated Mar. 12, 2013.

* cited by examiner

| OUTPUT VOLTAGE (VOUT) | GRADE CLASSIFICATION | W/B CONNECTION DESTINATION |
|---|---|---|
| LOWER THAN 2.85 V | GrA | REF3 |
| 2.85 V TO 2.95 V | GrB | REF2 |
| HIGHER THAN 2.95 V | GrC | REF1 |

SEMICONDUCTOR INTEGRATED CIRCUIT DEVICE AND HIGH-FREQUENCY POWER AMPLIFIER MODULE

BACKGROUND

The present invention relates to a semiconductor integrated circuit device and a high-frequency power amplifier module, and particularly relates to a technique effectively applied to a semiconductor integrated circuit device including a bias generation circuit, and a high-frequency power amplifier module including a bias generation circuit and a high-frequency power amplifier driven by the bias generation circuit.

Patent Document 1, for example, discloses a technique of driving, by a current, an output transistor of each stage in a high-frequency power amplifier device. The current is generated by a constant current circuit including a bandgap reference circuit, a CMOS differential amplifier circuit which receives, as one of two inputs, an output of the bandgap reference circuit, a PMOSFET which feeds back an output of the amplifier circuit to the other of the two inputs of the amplifier circuit, and a resistor that sets a current which flows in the PMOSFET.

Patent Document 2 discloses a technique of setting a bias current of a transistor in an amplification stage of a high-frequency power amplifier device, to a small temperature dependency when the amplifier stage is in a saturated operation mode, and to a large positive temperature dependency when the amplifier stage is in an unsaturated operation mode. The bias current is generated by using a bandgap reference circuit in the saturated operation mode, and is generated by using a temperature sensitive element (diode) in the unsaturated operation mode.

Patent Publication JP-A-2003-17954
Patent Publication JP-A-2009-218996

BRIEF SUMMARY

In a wireless communication terminal represented by a mobile phone, for example, control of transmission power is carried out according to a distance from a base station, and switch control of a transmission power mode for extending a battery life. Such power control is performed by appropriately controlling a bias of each output stage transistor in the high-frequency power amplifier device, and the bias is generated by using a bandgap reference circuit, for example.

However, in a voltage generated from the bandgap reference circuit, in some cases, a certain level of error between high-frequency power amplifier devices occurs depending on manufacturing variations or the like. In this case, there is a risk of variations in transmission power characteristics between the high-frequency power amplifier devices. Therefore, when the bias generation circuit and the output stage transistor are different semiconductor chips, for example, it is considered possible to combine the bias generation circuit and the output stage transistor so as to offset variations in transmission power characteristics of the both transistors, by using a result of a test of the bias generation circuit and the output stage transistor. However, in this case, management of the combination becomes complex, and also there is a risk that many semiconductor chips that cannot obtain combination partners.

Each embodiment described later has been made in view of such an aspect, and one of objects of the embodiments is to provide a semiconductor integrated circuit device and a high-frequency power amplifier module capable of reducing variations in the transmission power characteristics. The above and other objects and novel features of the present invention will become apparent from the description of the present specification and accompanying drawings.

Out of measures for solving the problems disclosed in the present application, an outline of representative measures is briefly described as follows.

That is, the present application includes a reference-voltage generating circuit, a regulator circuit, and a correction circuit which is provided between these circuits and which includes a buffer circuit having a voltage gain of approximately 1×. The correction circuit corrects an output voltage of the reference-voltage generating circuit. Specifically, the correction circuit includes first to third resistance paths having mutually different resistance values, and performs the correction by selectively supplying a current that reflects an output voltage of the buffer circuit to any one of the first to third resistance paths.

According to one embodiment disclosed in the present application, in a high-frequency power amplifier module, reduction of variations in transmission power characteristics can be realized.

DETAILED DESCRIPTION

Figure 1:
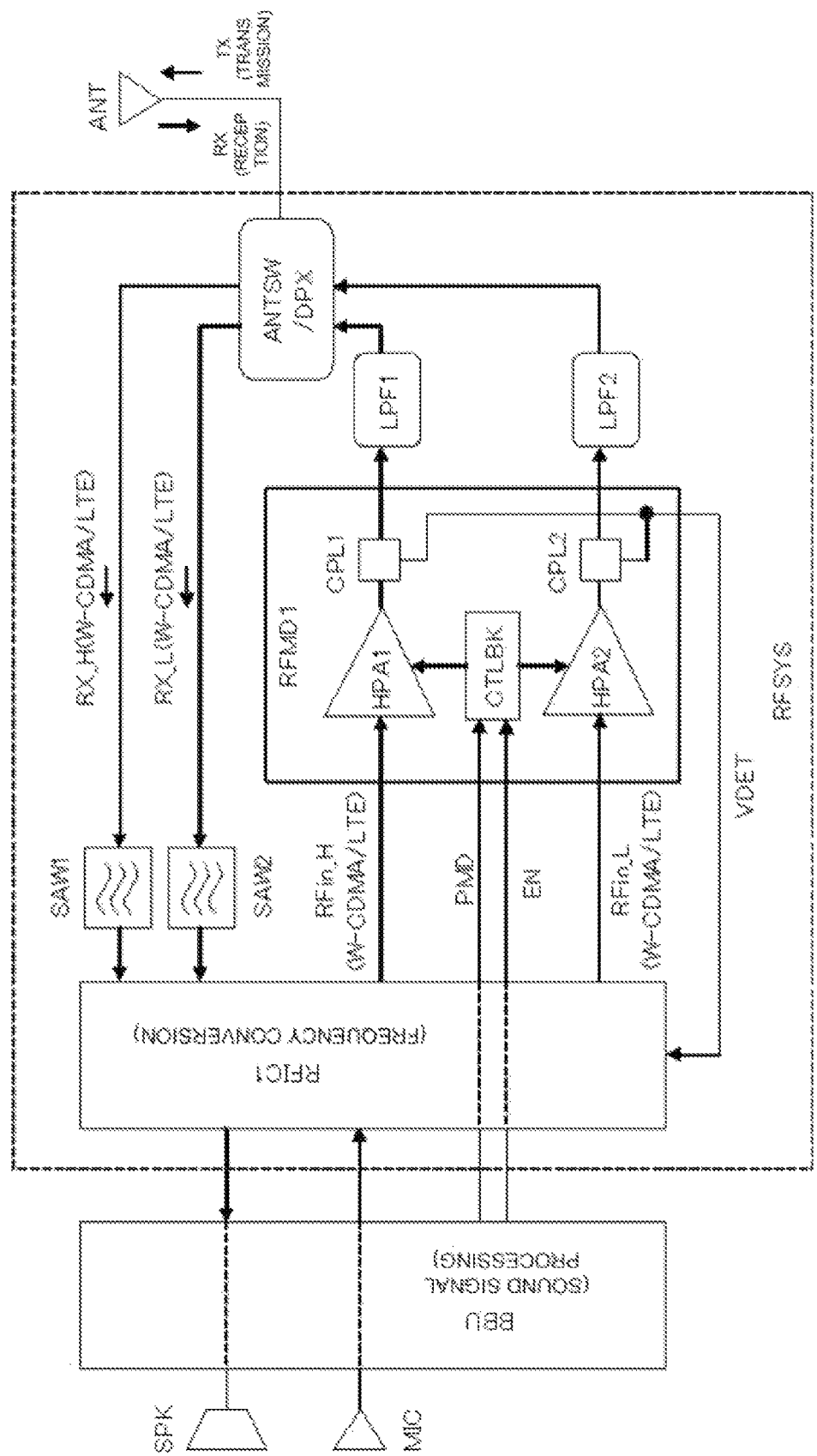
FIG. 1 is a block diagram illustrating a configuration example of a mobile phone system to which reduction of variations in the transmission characteristics is applied in a wireless communication system according to Embodiment 1 of the present invention.

The following embodiments will each be described as a plurality of sections or embodiments, if necessary. Except otherwise stated, those embodiments or sections are not irrelevant to each other, and each of them serves as a modification, specific description, or supplementary explanation of a part or all of the others. In the following embodiments, when referring to the number of elements and the like (including the number of pieces, a value, an amount, a range, etc.), the number and the like are not limited to specific numbers and may be equal to or above or below the specific numbers, except when specifically stated and when the numbers are clearly limited to specific numbers.

Further, in the following embodiments, it is needless to mention that configuration elements of the embodiments (including element steps and the like) are not necessarily essential except when specifically stated and when it is considered clearly essential in principle. Similarly, in the following embodiments, when referring to a shape of a configuration element and the like and a positional relationship and the like, it is assumed that a shape substantially near or similar to the shape is also included, except when specifically stated and when it is considered clearly not so. This is similarly applied to the above numerical values and ranges.

A circuit element configuring each functional block of the embodiment is not particularly limited, and is formed on a semiconductor substrate such as a monocrystalline silicon, by an integrated circuit technology of a known CMOS (complementary MOS transistor) and the like. In the embodiment, a MOSFET (Metal Oxide Semiconductor Field Effect Transistor) (abbreviated as a MOS transistor) is used as an example of a MISFET (Metal Insulator Semiconductor Field Effect Transistor), but does not exclude a non-oxide film as a gate insulation film. Although connection of a substrate potential of a MOS transistor is not specifically identified in the drawings, a connection method of the substrate potential is not particularly limited so long as the MOS transistor is in a normally operable range.

Hereinafter, embodiments of the present invention will be described in detail with reference to the accompanying drawings. In all the drawings for describing the embodiments, the same reference numerals in principle are attached to the same members, and their repetitive descriptions will be omitted.

Embodiment 1

Total Configuration of Mobile Phone System
(Wireless Communication Systems)

FIG. 1 is a block diagram illustrating a configuration example of a mobile phone system to which reduction of variations in the transmission characteristics is applied in a wireless communication system according to Embodiment 1 of the present invention. A mobile phone system in FIG. 1 includes a baseband unit BBU, a high-frequency system unit RFSYS, an antenna ANT, a speaker SPK, a microphone MIC, and the like. The BBU converts an analog signal into a digital signal to be used in the SPK and the MIC, performs various digital signal processes (modulation, demodulation, digital filtering, etc.) associated with communications, and outputs various control signals associated with the communications. Among the various control signals, there are included a power mode selection signal PMD for switching a transmission power mode, and a band selection signal EN for selecting a frequency band (band).

The high-frequency system unit RFSYS includes a high-frequency signal processing device RFIC1, SAW (Surface Acoustic Wave) filters SAW1 and SAW2, a high-frequency power amplifier module RFMD1, low-pass filters LPF1 and LPF2, an antenna switch ANTSW, and a duplexer DPX. The RFIC1 is configured by one single semiconductor chip including a transmission mixer circuit, a receiving mixer circuit, a low noise amplifier circuit (LNA), and the like, for example, and performs frequency conversion (up-conversion and down-conversion) and the like between a baseband signal mainly used in the BBU and a high-frequency signal used in the RFMD1. In this case, the RFIC1 is a W-CDMA (Wideband Code Division Multiple Access), an LTE (Long Term Evolution), and the like. In the W-CDMA standard or the LTE standard, more than ten frequency bands (bands) are determined. Although not particularly limited, the RFIC1 corresponds to a high band and a low band. The high band is a band near 2 GHz, for example, and the low band is a band near 900 MHz, for example.

The high-frequency power amplifier module RFMD1 is realized by one module wiring substrate (ceramic wiring substrate, for example), for example, and includes high-frequency power amplifier circuits HPA1 and HPA2, a control block CTLBK, and directional couplers (couplers) CPL1 and CPL2. Although not particularly limited, the HPA1, the HPA2, and the CTLBK are realized by one or a plurality of semiconductor chips, and are mounted on the module wire substrate. The CPL1 and the CPL2 are formed using a wiring layer or the like on the module wire substrate. The high-frequency power amplifier circuit HPA1 performs power amplification by receiving a high-frequency input signal RFin_H of a high band of the W-CDMA (or the LTE) which is output via the transmission mixer circuit in the high-frequency signal processing device RFIC1. The high-frequency power amplifier circuit HPA2 performs power amplification by receiving a high-frequency input signal RFin_L for a low band of the W-CDMA (or the LTE) which is output via the transmission mixer circuit of the RFIC1.

The control block CTLBK selects one of a high band side (HPA1 side) or a low band side (HPA1 side) on the basis of the band selection signal EN which is input from the baseband unit BBU via the high-frequency signal processing device RFIC1. Furthermore, the CTLBK sets a power mode (high-power mode, middle power mode, and row power mode, for example) of a selected band (HPA1 or HPA2), on the basis of the power mode selection signal PMD which is input from the BBU via the RFIC1.

The couplers CPL1 and CPL2 detect respectively power levels of high-frequency output signals from the high-frequency power amplifier circuits HPA1 and HPA2. A power detection circuit not shown converts a detection signal into a power detection voltage VDET having a voltage corresponding to a size of the detection signal. The high-frequency signal processing device RFIC1 controls an amplitude of the high-frequency input signal RFin_H or RFin_L according to the VDET. In the W-CDMA and the LTE, there is used a modulation system such as HPSK (Hybrid Phase Shift Keying) and QAM (Quadrature Amplitude Modulation) that generate an envelope fluctuation. Therefore, linear amplification is used in the HPA1 and the HPA2. Consequently, as shown in FIG. 1, there is a case that transmission power is controlled on the basis of a combination of an amplitude level of RFin_L or RFin_H and a power mode of the HPA1 and the HPA2.

The low-pass filter LPF1 removes unnecessary harmonic components from the high-frequency output signal of the high-frequency power amplifier circuit HPA1, and outputs a resultant high-frequency output signal to the antenna switch ANTSW and the duplexer DPX. The low-pass filter LPF2 removes unnecessary harmonic components from the high-frequency output signal of the high-frequency power amplifier circuit HPA2, and outputs a resultant high-frequency output signal to the antenna switch ANTSW and the duplexer DPX. The ANTSW selects a connection path of the antenna ANT (in this case, one of a transmission and reception path of the high band and a transmission and reception path of the low band), on the basis of a switching signal not shown. For example, the duplexer DPX divides a transmission signal and a reception signal according to a transmission/reception frequency band. Although not shown, the low-pass filter LPF1 includes a duplexer for the high band and a duplexer for the low band.

For example, a high-frequency output signal from the high-frequency power amplifier circuit HPA1 is transmitted to the antenna ANT as a transmission signal TX via the duplexer for the high band and the antenna switch ANTSW. Conversely, a reception signal RX received by the ANT is output to the SAW filter SAW1 as a reception signal RX_H via the ANTSW and the duplexer for the high band. Similarly, a high-frequency output signal from the high-frequency power amplifier circuit HPA2 is transmitted to the ANT as the TX via the duplexer for the low band and the ANTSW. Conversely, the RX received by the ANT is output to the SAW filter SAW2 as a reception signal RX_L via the ANTSW and the duplexer for the low band. The SAW1 extracts a predetermined reception frequency band from the RX_H, and outputs the predetermined reception frequency band to the high-frequency signal processing device, and the SAW2 extracts a predetermined reception frequency band from the RX_L, and outputs the predetermined reception frequency band to the RFIC1. The RFIC1 amplifies the output signal from the SAW1 and the SAW2, by the low noise amplifier circuit, and thereafter, converts the amplified output signal into a signal of the base band, by using a receiving mixer circuit.

As described above, the high-frequency power amplifier circuits HPA1 and HPA2 operate in a plurality of power modes on the basis of the control from the control block CTLBK. Although details will be described later, the CTLBK sets the power mode by appropriately controlling biases of the HPA1 and the HPA2. In this case, linear amplification (reduced of distortion) and low power consumption (improvement of power addition efficiency) and the like are used in the HPA1 and the HPA2. Therefore, it is preferable that the biases are set to a target value in high accuracy. Accordingly, the use of the system according to the present embodiment described later is beneficial.

Total Configuration of the High-Frequency Power Amplifier Module

Figure 2:
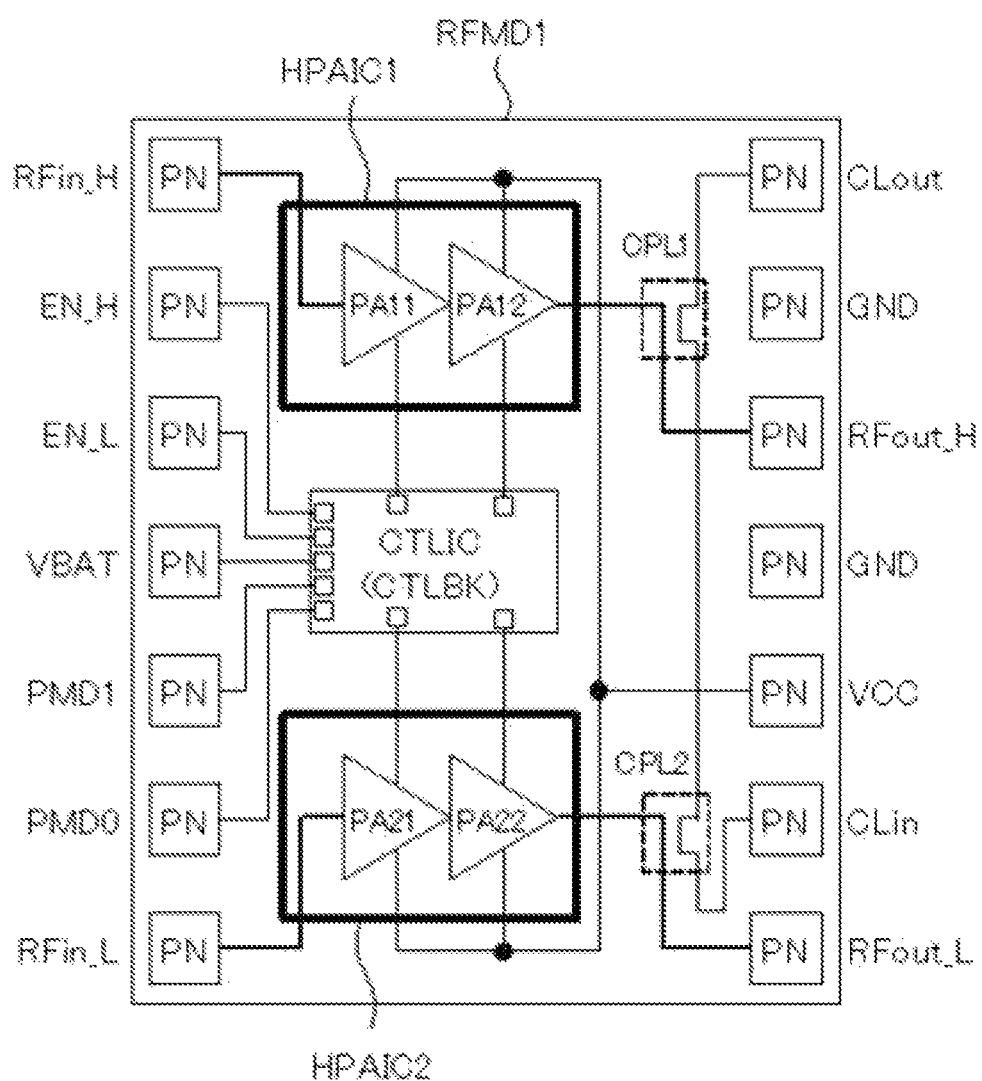
FIG. 2 is a total block diagram illustrating a schematic configuration example of a high-frequency power amplifier module as a whole in the wireless communication system in FIG. 1.

FIG. 2 is a total block diagram illustrating a schematic configuration example of a high-frequency power amplifier module as a whole in the wireless communication system in FIG. 1. The high-frequency power amplifier module RFMD1 illustrated in FIG. 2, includes 14 external terminals PN on a module wiring substrate, for example. An external terminal PN (RFin_H) is an input terminal for the high-frequency input signal RFin_H of the high band, and an external terminal PN (RFin_L) is an input terminal for the high-frequency input signal RFin_L of the low band. An external terminal PN (RFout_H) is an output terminal for a high-frequency output signal RFout_H of the high band, and an external terminal PN (RFout_L) is an output terminal for a high-frequency output signal RFout_L of the low band.

An external terminal PN (EN_H) is an input terminal for a band selection signal EN_H when selecting the high band, and an external terminal PN (EN_L) is an input terminal for a band selection signal EN_L when selecting the low band. An external terminal PN (VBAT) is a supply terminal of a control power supply voltage VBAT. External terminals PN (PMD0) and PN (PMD1) are input terminals for power mode selection signals PMD0 and PMD1. An external terminal PN (VCC) is a supply terminal of an amplifier power supply voltage VCC, and an external terminal PN (GND) is a supply terminal of a ground power supply voltage GND. External terminals PN (CLin) and PN (CLout) are terminals for couplers.

The high-frequency power amplifier module RFMD1 is further mounted with three semiconductor chips (two high-frequency power amplifier chips HPAIC1 and HPAIC2, and one control chip CTLIC) on the module wiring substrate. Two directional couplers (couplers) CPL1 and CPL2 are formed using a wiring layer and the like on the module wiring substrate. The HPAIC1 corresponds to the HPA1 in FIG. 1, and includes continuously-connected two-stage power amplifier circuits PA11 and PA12. The HPAIC2 corresponds to the HPA2 in FIG. 1, and includes continuously-connected two-stage power amplifier circuits PA21 and PA22. Although each of the PA11, the PA12, the PA21, and the PA22 is not particularly limited, each circuit is formed with a heterojunction bipolar transistor (HBT) as an amplifying element, for example.

The power amplifier circuits PA11 and PA12 amplify the high-frequency input signal RFin_H from the external terminal PN (RFin_H), by using the power supply voltage VCC from the external terminal PN (VCC), and outputs the high-frequency output signal RFout_H to the external terminal PN (RFout_H) via the coupler CPL1. The power amplifier circuits PA21 and PA22 amplify the high-frequency input signal RFin_L from the external terminal PN (RFin_L), by using the VCC from the PN (VCC), and outputs the high-frequency output signal RFout_L to the external terminal PN (RFout_L) via the coupler CPL2. The CPL1 and the CPL2 are inserted in series onto the module wiring path between the external terminal PN (CLin) and the external terminal PN (CLout). For example, one of the PN (CLin) and the PN (CLout) is connected to a terminating resistor and the like, and the other is connected to a power detection circuit (not shown) that converts a detection signal by the CPL1 or the CPL2 into the power detection voltage (VDET).

The control chip CTLIC corresponds to the control block CTLBK in FIG. 1, is configured by a MOS transistor or the like on the silicon substrate, for example, and operates using the power supply voltage VBAT from the external terminal PN (VBAT). The CTLIC controls activation and non-activation of the high-frequency power amplifier chip HPAIC1 according to a logic level of the band selection signal EN_H from the external terminal PN (EN_H), and controls activation and non-activation of the high-frequency power amplifier chip HPAIC2 according to a logic level of the band selection signal EN_L from the external terminal PN (EN_L). Further, the CTLIC selects a high power mode, a middle power mode, and a low power mode, according to a combination of logic levels of the external terminals PN (PMD0) and PN (PMD1), for the high-frequency power amplifier device which is activated.

Schematic Circuit Configuration of the Control Chip (Semiconductor Integrated Circuit Device)

Figure 3:
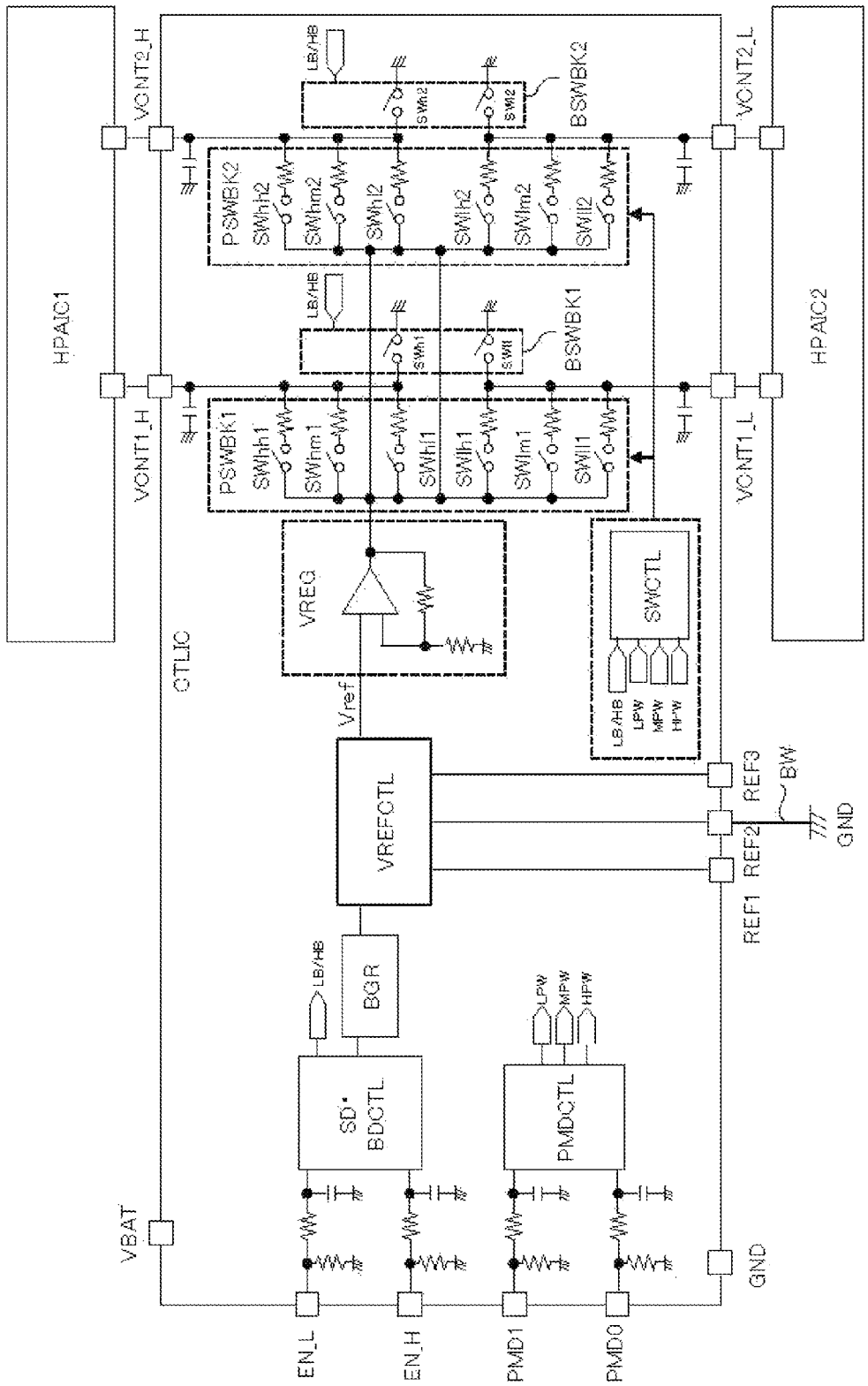
FIG. 3 is a circuit diagram illustrating a schematic configuration example of a control chip in FIG. 2.

FIG. 3 is a circuit diagram illustrating a schematic configuration example of the control chip in FIG. 2. The control chip (semiconductor integrated circuit device) CTLIC illustrated in FIG. 2 includes a shutdown band control circuit SD·BDCTL, a power mode control circuit PMDCTL, a bandgap reference circuit BGR, a reference-voltage correction circuit VREFCTL, and a regulator circuit VREG. The CTLIC further includes a switch control circuit SWCTL, power switch blocks PSWBK1 and PSWBK2, and band switch blocks BSWBK1 and BSWBK2.

The shutdown band control circuit SD·BDCTL causes a low-band selection signal LB or a high-band selection signal HB to be output, according to the band selection signals EN_H and EN_L, or shifts the control chip CTLIC as a whole to a shutdown mode. The SD·BDCTL performs non-activation of the bandgap reference circuit BGR as a shutdown mode, when both the EN_H and the EN_L are in a non-selected state, for example. The power mode control circuit PMDCTL outputs any one of a high-power mode selection signal HPW, a middle-power mode selection signal MPW, and a low-power mode selection signal LPW, according to the power mode selection signals PMD0 and PMD1.

As is widely known, the bandgap reference circuit BGR is a circuit that generates a predetermined bandgap voltage (reference voltage) of small temperature dependency by offsetting between a voltage of a positive temperature coefficient generated by taking out a difference (ΔVBE) between base-emitter voltages (VBE) of a bipolar transistor, and a voltage of a negative temperature characteristic of the VBE. Although a bandgap reference circuit is used in this case, the circuit is not limited to the bandgap reference circuit, and it is also possible to substitute the bandgap reference circuit with other reference-voltage generating circuits. For example, a circuit that generates a reference voltage with small temperature dependency, by utilizing a difference in a threshold voltage of the MOS transistor, may be used.

The reference-voltage correction circuit VREFCTL is one of main characteristics of the present embodiment, and will be described in detail later. The reference-voltage correction circuit VREFCTL corrects the bandgap voltage from the bandgap reference circuit BGR, and generates a reference voltage Vref after correction. In this case, the VREFCTL performs the correction by connecting any one of a plurality (three in this case) of terminals (REF1 to REF3) to the ground power supply voltage GND via a bonding wire BW. In this case, the regulator circuit VREG is configured by an amplifier circuit having a negative feedback configuration, and generates a predetermined output voltage from the reference voltage Vref after correction, according to a value of a feedback resistor.

The power switch block PSWBK1 includes six series-connected circuits consisting of switches and resistors. Three series-connected circuits out of the six are connected in parallel between the output node of the regulator circuit VREG and a terminal for a bias control signal VCNT1_H. The three switches including SWhh1, SWhm1, and SWhl1 are for a high band first stage, and are for high power, for middle power, and for low power, respectively. The other three series-connected circuits are connected in parallel between the output node of the VREG and a terminal for a bias control signal VCNT1_L. The three switches including SWlh1, SWlm1, and SWll1 are for a low band first stage, and are for high power, for middle power, and for low power, respectively.

The power switch block PSWBK2 includes six series-connected circuits consisting of switches and resistors, in a similar manner to that of the PSWBK1. Three series-connected circuits out of the six are connected in parallel between the output node of the regulator circuit VREG and a terminal for a bias control signal VCNT2_H. The three switches including SWhh2, SWhm2, and SWhl2 are for a high band later stage, and are for high power, for middle power, and for low power, respectively. The other three series-connected circuits are connected in parallel between the output node of the VREG and a terminal for the bias control signal VCNT2_L. The three switches including SWlh2, SWlm2, and SWll2 are for a low band later stage, and are for high power, for middle power, and for low power, respectively.

The band switch block BSWBK1 includes a switch SWh1 which is connected between a terminal for the bias control signal VCNT1_H and the ground power supply voltage GND, and a switch SWl1 which is connected between a terminal for the bias control signal VCNT1_L and the GND. The band switch block BSWBK2 includes a switch SWh2 which is connected between a terminal for the bias control signal VCNT2_H and the ground power supply voltage and GND, and a switch SWl2 which is connected between a terminal for the bias control signal VCNT2_L and the GND. The ON and OFF state of the switches SWh1, SWl1, SWh2, and SWl2 is controlled by the low-band selection signal LB and the high-band selection signals HB described above. The switch control circuit SWCTL controls ON and OFF of each switch in the power switch blocks PSWBK1 and PSWBK2, according to the low-band selection signal LB, the high-band selection signal HB, the high-power mode selection signal HPW, the middle-power mode selection signal MPW, and the low-power mode selection signal LPW described above.

For example, when operating in the high-power mode of the high band, in the band switch blocks BSWBK1 and BSWBK2, the switches SWh1 and SWh2 are controlled to be OFF, and the switches SWl1 and SWl2 are controlled to be ON, respectively. Further, in the power switch blocks PSWBK1 and PSWBK2, the switches SWhh1 and SWhh2 are controlled to be ON, and the remaining switches are controlled to be OFF. Accordingly, the output node of the regulator circuit VREG is connected to a terminal for the bias control signal VCNT1_H via the SWhh1 and a resistor, and is also connected to a terminal for the bias control signal VCNT2_H via the Whh2 and a resistor. As a result, the VCNT1_H and the VCNT2_H have a predetermined bias voltage, and the bias control signals VCNT1_L and VCNT2_L have the ground power supply voltage GND.

When operating in the low-power mode of the low band, in the band switch blocks BSWBK1 and BSWBK2, the switches SWh1 and SWh2 are controlled to be ON, and the switches SWl1 and SWl2 are controlled to be OFF, respectively. Further, in the power switch blocks PSWBK1 and PSWBK2, the switches SWll1 and SWll2 are controlled to be ON, and the remaining switches are controlled to be OFF. Accordingly, the output node of the regulator circuit VREG is connected to a terminal for the bias control signal VCNT1_L via the SWll1 and a resistor, and is also connected to a terminal for the bias control signal VCNT2_L via the SWll2 and a resistor. As a result, the VCNT1_L and the VCNT2_L have a predetermined bias voltage, and the bias control signals VCNT1_H and VCNT2_H have the ground power supply voltage GND.

Detailed Configuration of the Main Part (the Surrounding of the Reference-Voltage Correction Circuit) of the Control Chip (Semiconductor Integrated Circuit Device)

Figure 4:
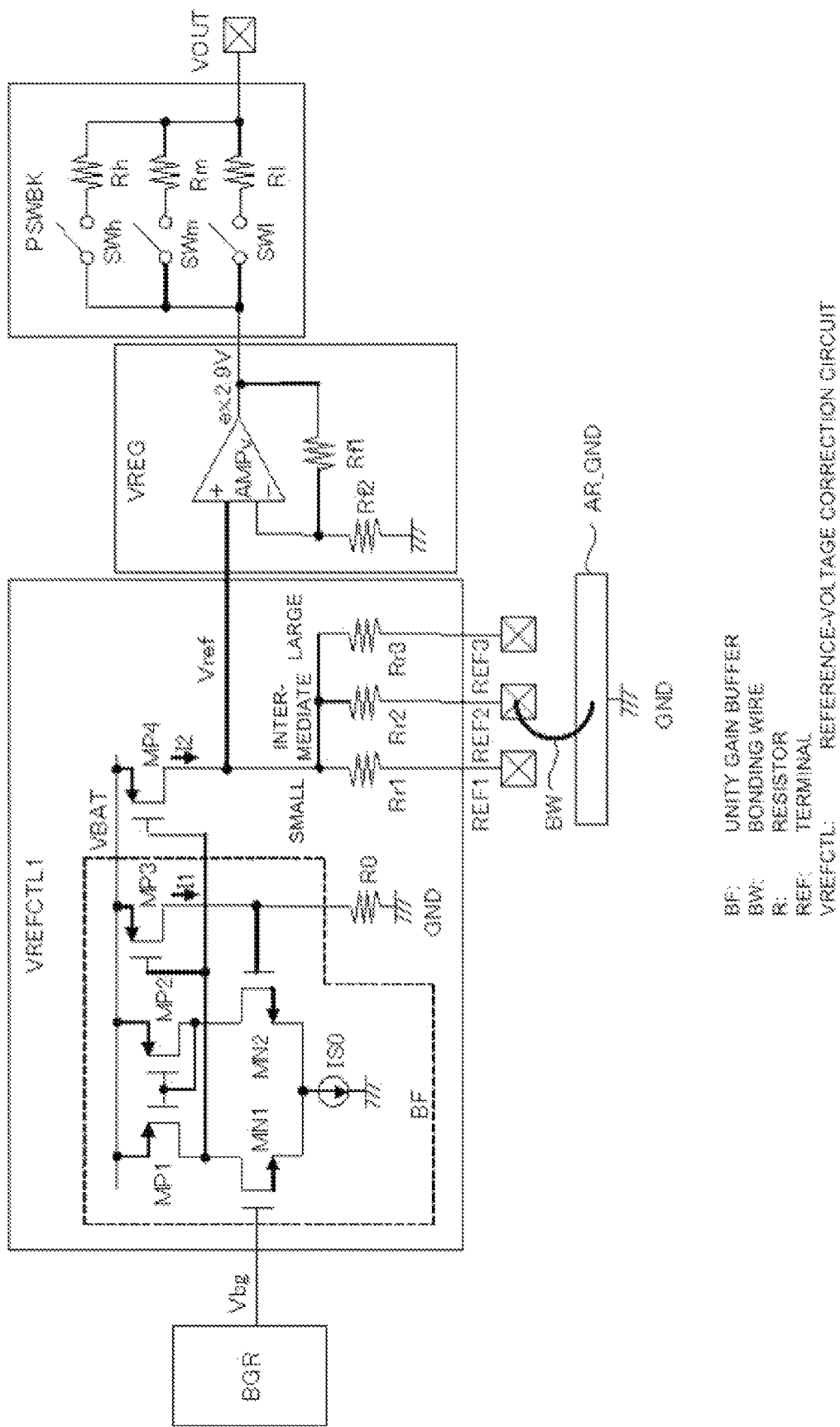
FIG. 4 is a circuit diagram illustrating a detailed configuration example of a main part including a reference-voltage correction circuit in the control chip in FIG. 3.

FIG. 4 is a circuit diagram illustrating a detailed configuration example of a main part including the reference-voltage correction circuit in the control chip in FIG. 3. In FIG. 4, the bandgap reference circuit BGR, the reference-voltage correction circuit VREFCTL, and the regulator circuit VREG in FIG. 3 are extracted and illustrated, and also, parts of the power switch blocks PSWBK1 and PSWBK2 are representatively illustrated. A reference-voltage correction circuit VREFCTL1 illustrated in FIG. 4 includes NMOS transistors MN1 and MN2, PMOS transistors MP1 to MP4, a current source IS0, and resistors R0, and Rr1 to Rr3.

The NMOS transistors MN1 and MN2, the PMOS transistors MP1 and MP2, and the current source IS0 configure a differential amplifier circuit that uses the MN1 and the MN2 as a differential pair of transistors, uses the IS0 as a tail current source, and uses the MP1 and the MP2 as amplification load current sources. An output voltage of the differential amplifier circuit (common drain voltage of the MN1 and the MP1) is applied to the gate of the PMOS transistor MP3 to the source of which the power supply voltage VBAT is supplied. The gate of the MN1 is applied with a bandgap voltage Vbg from the bandgap reference circuit BGR, and the gate of the MN2 is fed back with a drain voltage of the MP3. A gate voltage of the MN2 (drain voltage of the MP3) converges to the Vbg by a differential amplifier circuit of this negative feedback configuration (unity gain buffer BF of one times of a gain that has the gate of the MN1 as an input and has the drain of the MP3 as an output). The drain of the MP3 is further connected to the ground power supply voltage GND via the resistor R0. A current I1 (=Vbg/R0) determined by the Vbg and the R0 flows between the source and the drain of the MP3, and a gate voltage of the MP3 is controlled in the BF so that the current flows.

A source-drain current I1 of the PMOS transistor MP3 is transferred to the PMOS transistor MP4 that configures a current mirror circuit with the MP3. It is assumed that transistor sizes of the MP3 and MP4 are equal, so that a source-drain current I2 of the MP4 becomes equal to the I1. The drain of the MP4 is connected in common to one end of three resistors Rr1 to Rr3, respectively, and the other ends of the Rr1 to the Rr3 are connected to the terminals REF1 to REF3, respectively. Any one of the REF1 to the REF3 is connected to a mounting area AR_GND of the ground power supply voltage GND via the bonding wire BW. Resistance values of the Rr1 to the Rr3 are in a relationship of Rr1<Rr2<Rr3. The resistance value of the Rr2 is set to become a center value of the resistance value of the Rr1 and the resistance value of the Rr3, for example.

When the bandgap voltage Vbg is in a certain range, the terminal REF2 is connected to the mounting area AR_GND. As a result, the reference voltage Vref becomes (I2×Rr2), using the source-drain current I2 (=Vbg/R0) of the MP4, and the resistance value of the resistor Rr2. On the other hand, when the Vbg is deviated to a positive side from the certain range, the terminal REF1 is connected to the AR_GND. As a result, when a variation of the Vbg is +α, the Vref becomes (I2×Rr1), using the source-drain current I2 (=(Vbg+α)/R0) of the MP4 and the resistance value of the resistor Rr1. In this case, the increase of the I2 following +α can be offset by a resistance reduction from the Rr2 associated with the Rd.

Conversely to the case of the terminal REF1, when the bandgap voltage Vbg is deviated to a negative side from the certain range, the terminal REF3 is connected to the mounting area AR_GND. As a result, when a variation of the Vbg is −α, the Vref becomes (I2×Rr3), using the source-drain current I2 (=(Vbg−α)/R0) of the MP4, and the resistance value of the resistor Rr3. In this case, a decrease of I2 following −α can be offset by a resistance increase from the Rr2 associated with the Rr3. Although not particularly limited, the I2 is 20 μA or the like, and resistance values of the Rr1, the Rr2, and the Rr3 are 58.5 kΩ, 60.0 kΩ, and 61.5 kΩ, respectively, for example. The Vbg is representatively about 1.25 V, and the power supply voltage VBAT is 3.5 V or the like. The Rr1 to the Rr3 are not particularly limited, and are realized by a polysilicon layer on the semiconductor chip.

The reference voltage Vref obtained in this manner is applied to a positive-electrode side input node of the amplifier circuit AMPv that configures the regulator circuit VREG. The output voltage of the AMPv is voltage-divided by the feedback resistors Rf1 and Rf2, and the voltage-divided voltages are fed back to a negative-electrode side input node of the AMPv. Accordingly, from the VREG, there is generated a regulator voltage (about 2.9 V, for example) defined by ((Rf1/Rf2)+1)×Vref). The regulator voltage is output to an output voltage terminal VOUT via any one of a high-power mode resistor Rh, a middle-power mode resistor Rm, and a low-power mode resistor Rl, in the power switch block PSWBK. Selection of the Rh, the Rm, and the Rl is performed by a high-power mode switch SWh, a middle-power mode switch SWm, and a low-power mode switch SWl, respectively.

Although not particularly limited, the resistance values of the resistors Rh, Rm, and Rl are in a relationship of Rh<Rm<Rl. Following this, when a predetermined load is connected to the output voltage terminal VOUT, a voltage value of the VOUT becomes in a relationship of high-power mode time>middle-power mode time>low-power mode time. The VOUT corresponds to terminals for the bias control signals VCNT1_H, VCNT2_H, VCNT1_L, and VCNT2_L in FIG. 3. Although details will be described later, the voltages of the terminals are reflected to base biases of the power amplifier circuits (heterojunction bipolar transistors, for example) PA11, PA12, PA21, and PA22 in FIG. 2. Accordingly, sizes of gains of the power amplifier circuits are controlled in the order of high-power mode time>middle-power mode time>low-power mode time.

In such a configuration, one of main characteristics of Embodiment 1 is that the reference-voltage correction circuit VREFCTL is provided between the bandgap reference circuit BGR and the regulator circuit VREG. As described above, in the VREFCTL, by connecting any one of the terminals REF1 to REF3 to the mounting area AR_GND via the bonding wire BW in accordance with a degree of variations in the bandgap voltage Vbg, variations in the Vbg can be corrected. It then becomes possible to generate a substantially constant reference voltage Vref after the correction. Further, because the Vref can be maintained at approximately a constant value (the error of the Vref between the semiconductor chips can be reduced), the power modes of the high-frequency power amplifier chips HPAIC1 and HPAIC2 can be set to a target value with high accuracy, and it becomes possible to reduce variations in linear characteristics (variations in distortion characteristics) and variations in power consumption (variations in power addition efficiency) of the HPAIC1 and the HPAIC2. That is, variations in transmission power characteristics can be reduced. The BW is representatively gold, copper, or the like. Because a resistance value of the BW is negligibly small compared to resistance values of the resistors Rh, Rm, and Rl, errors associated with the BW are no problems.

As a comparative example of FIG. 4, for example, there is considered a system that performs correction by directly applying the bandgap voltage Vbg to the regulator circuit VREG and by setting the feedback resistors Rf1 and Rf2 of the VREG as variable resistors, without providing the reference-voltage correction circuit VREFCTL1. However, because the bandgap reference circuit BGR has usually a high output impedance, it is preferable in view of high accuracy that the high impedance is converted to a low impedance via a buffer circuit and then the low impedance is applied to the VREG. From this viewpoint, the VREFCTL1 has a buffer function associated with a differential amplifier circuit of a negative feedback configuration (unity gain buffer BF of one times of a gain).

Further, if amplification (gain of about two times, for example) is directly performed by the regulator circuit VREG when there are variations in the bandgap voltage Vbg, a variation amount is also amplified. Therefore, in order to achieve high accuracy, it is preferable to suppress variations in the Vbg before the VREG is input. From this viewpoint, it is beneficial that the reference-voltage correction circuit VREFCTL1 having the gain buffer BF as a main body performs the correction. Further, when the gain (about two times) of the VREG is changed by using the feedback resistors Rf1 and Rf2 for the variable resistors, there is a risk of reduction in stability (accuracy) because the frequency characteristics of the VREG and phase margin characteristics also change. From this viewpoint, by performing the correction by the VREFCTL1 that has the unity gain buffer as a main body, it is possible to obtain stable characteristics over a wide band.

Figure 5:
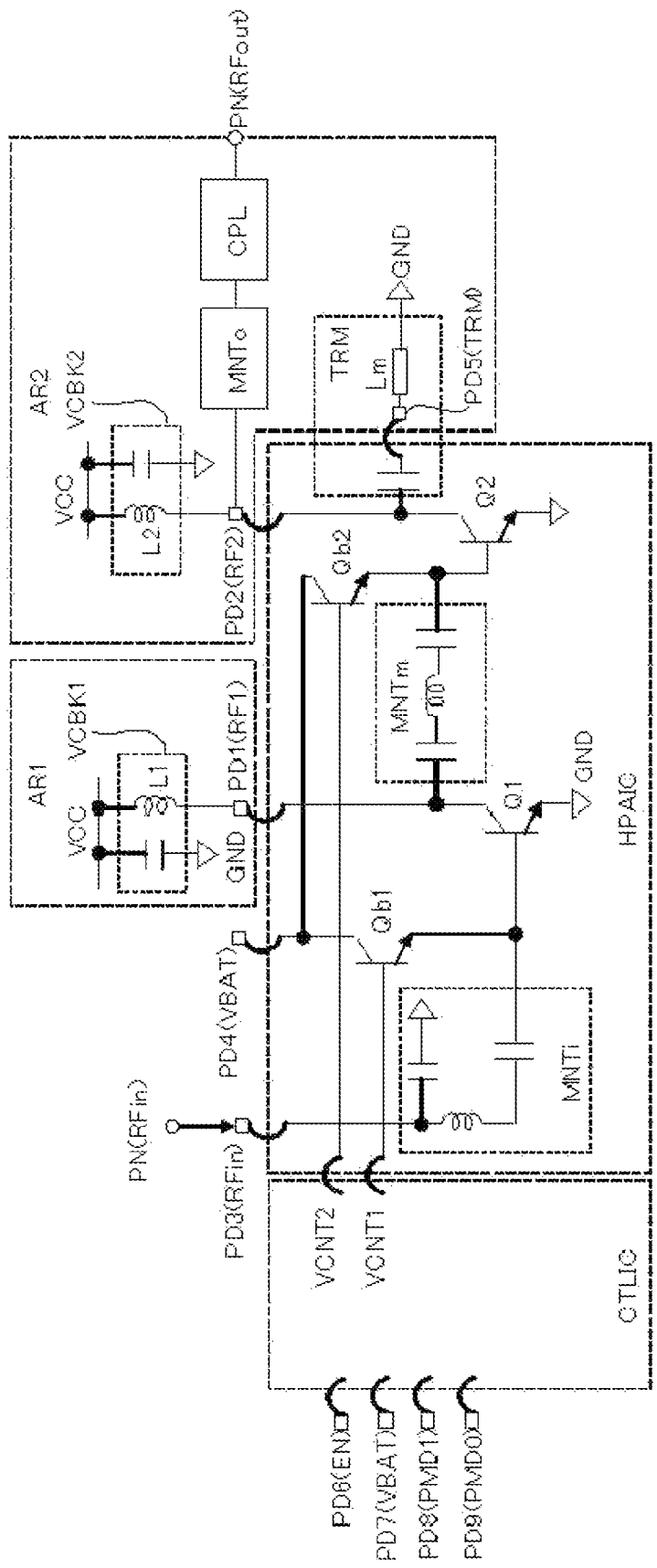
FIG. 5 is a circuit diagram illustrating a detailed configuration example of the surrounding of a high-frequency power amplifier chip in the high-frequency power amplifier module in FIG. 2.

Detailed Circuit Configuration of the Surrounding of the High-Frequency Power Amplifier Chip FIG. 5 is a circuit diagram illustrating a detailed configuration example of the surrounding of a high-frequency power amplifier chip in the high-frequency power amplifier module in FIG. 2. The high-frequency power amplifier chip HPAIC illustrated in FIG. 5 is a representative illustration of one of the HPAIC1 and the HPAIC2 in FIG. 2. A circuit configuration example of the surrounding of the HPAIC is illustrated including peripheral circuits provided outside the HPAIC (on the module wiring substrate). The HPAIC in FIG. 5 includes an input matching circuit MNTi, amplifying bipolar transistors (HBT, for example) Q1 and Q2, bias bipolar transistors Qb1 and Qb2, an interstage matching circuit MNTm, and a part of the high-harmonic termination circuit TRM. Usually, a size of the transistor Q2 is set very large compared to the Q1.

In FIG. 5, the high-frequency input signal RFin from the external terminal PN (RFin) ((PN (RFin_H) or PN (RFin_L) in FIG. 2) is input to the base of the amplifying bipolar transistor Q1 at a first stage (PA11 or PA12 in FIG. 2) that is emitter-grounded via the input matching circuit MNTi including a coil, an AC coupling capacitor, and the like. Between the base of the Q1 and the power supply voltage VBAT, there is connected an emitter-collector path of the bias bipolar transistor Qb1 at a first stage. The Qb1 is a collector ground (emitter follower). The bias control signal VCNT1 (VCNT1_H or VCNT1_L in FIG. 3) from the control chip CTLIC is applied to the base of the collector ground. A predetermined bias voltage (bias current) according to the VCNT1 is supplied from the emitter toward the base of the Q1.

The power supply voltage is supplied to the collector of the amplifying bipolar transistor Q1 at the first stage, via the power supply block VCBK1 formed in the mounting area AR1 outside the chip. The VCBK1 includes a choke coil L1 and the like for supplying the power supply voltage VCC to the collector of the Q1. In the high-frequency power amplifier chip HPAIC, the collector output signal of the Q1 is input to the base of the amplifying bipolar transistor Q2 at a later stage (PA21 or PA22 in FIG. 2) that is emitter-grounded via the interstage matching circuit MNTm including a coil, an alternating current (AC) coupling capacitor, and the like. Between the base of the Q2 and the power supply voltage VBAT, there is connected an emitter-collector path of the bias bipolar transistor Qb2 at a later stage. The Qb2 is a collector ground (emitter follower). The bias control signal VCNT2 (VCNT2_H or VCNT2_L in FIG. 3) from the control chip CTLIC is applied to the base of the collector ground. A predetermined bias voltage (bias current) according to the VCNT2 is supplied from the emitter toward the base of the Q2.

The power supply voltage is supplied to the collector of the amplifying bipolar transistor Q2 at the later stage, via the power supply block VCBK2 formed in the mounting area AR2 outside the chip. The VCBK2 includes a choke coil L2 and the like for supplying the power supply voltage VCC to the collector of the Q2. The output signal of the collector Q2 is output from the external terminal PN (RFout) (PN (RFout_H) or PN (RFout_L) in FIG. 2) via sequentially an output matching circuit MNTo and a directional coupler (coupler) CPL. The MNTo and the CPL are formed in the AR2. Further, the high-harmonic termination circuit TRM consisting of a series-connected circuit of a capacitor and a coil Lm is connected between a collector node of the Q2 and the ground power supply voltage GND. The TRM removes high-harmonic components included in the collector output signal of the Q2. The coil Lm in the TRM is realized by a wiring (transmission line) on the module wiring substrate in the AR2.

Layout Configuration of the High-Frequency Power Amplifier Module [1]

Figure 6:
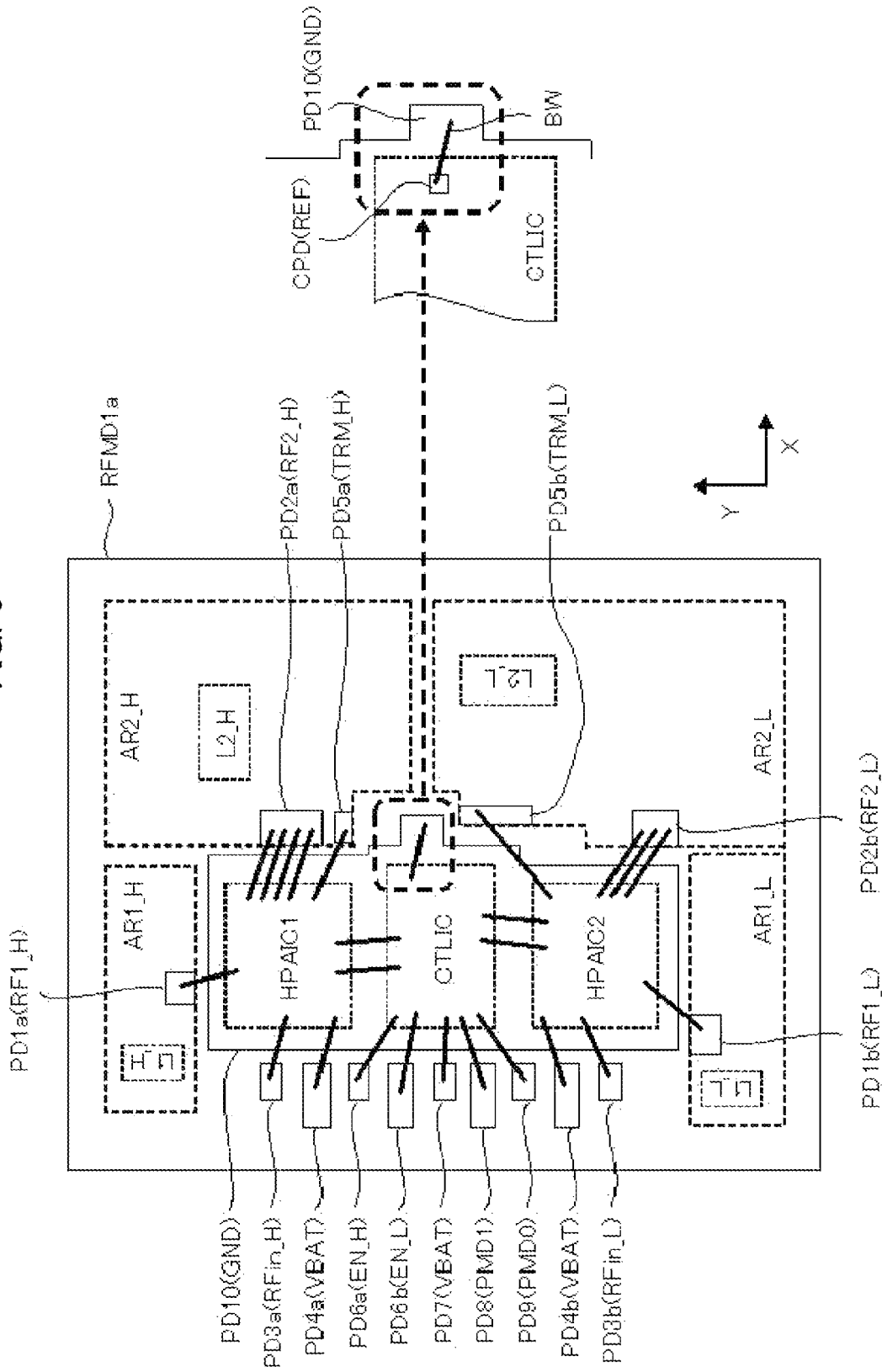
FIG. 6 is a plan view illustrating a schematic layout configuration example of the high-frequency power amplifier module in FIG. 2.

FIG. 6 is a plan view illustrating a schematic layout configuration example of the high-frequency power amplifier module in FIG. 2. In FIG. 6, a symbol corresponding to each symbol in FIG. 5 is appropriately added. A high-frequency power amplifier module RFMD1a in FIG. 6 is configured using a module wiring substrate (ceramic wiring substrate, for example). On a surface of the module wiring substrate (ceramic wiring substrate, for example), there is formed an electrode (pad) PD10 (GND) of a large area to which the ground power supply voltage GND is supplied. On the PD10 (GND), three semiconductor chips are mounted (rear surface electrode of each semiconductor chip is connected) in a form that two high-frequency power amplifier chips HPAIC1 and HPAIC2 sandwich the control chip CTLIC in a Y-axis direction.

In an X-axis direction, at one side across the electrode PD10 (GND), there are arranged a plurality of electrodes (PD3a, PD4a, PD6a, PD6b, PD7, PDB, PD9, PD4b, and PD3b) in the Y-axis direction, and there are provided mounting areas AR2_H and AR2_L at the other side. The PD3a and PD4a are for the high-frequency input signal RFin_H and for the power supply voltage VBAT, and are connected to the high-frequency power amplifier chip HPAIC1 via the bonding wire BW. Similarly, the PD3b and PD4b are for the high-frequency input signal RFin_L and for the VBAT, and are connected to the high-frequency power amplifier chip HPAIC2 via the bonding wire BW. The PD4a (VBAT) and PD4b (VBAT) are applied to the bias bipolar transistors Qb1 and Qb2, as illustrated in FIG. 5. The PD6a, PD6b, PD7, PDB, and PD9 are for the band selection signals EN_H and EN_L, for the power supply voltage VBAT, and for the power mode selection signals PMD0 and PMD1, and are connected to the control chip CTLIC via the bonding wire BW.

The mounting area AR2_H is provided near the high-frequency power amplifier chip HPAIC1, and the mounting area AR2_L is provided near the high-frequency power amplifier chip HPAIC2. In describing the AR2_H as a representative, for example, the electrodes PD2a and PD5a are formed and various external parts such as the choke coil L2_H are also mounted, on the AR2_H. The collector output signal RF2 from the amplifying bipolar transistor Q2 at the later stage in the HPAIC1 is input to the PD2a, via a plurality of bonding wires BW, as illustrated in FIG. 5. The bonding wire BW for forming the high-harmonic termination circuit TRM with the HPAIC1 is connected to the PD5a, as illustrated in FIG. 5. Other various circuit components as shown in the mounting area AR2 in FIG. 5 are formed and mounted in the AR2_H.

In the Y-axis direction, at one side across the electrode PD10 (GND), there is provided a mounting area AR1_H, and a mounting area AR1_L is provided at the other side. The mounting area AR1_H is provided near the high-frequency power amplifier chip HPAIC1, and the mounting area AR1_L is provided near the high-frequency power amplifier chip HPAIC2. In describing the AR1_H as a representative, for example, the electrodes PD1a is formed and various external parts such as the choke coil L1_H are also mounted, on the AR1_H. The collector output signal RF1 from the amplifying bipolar transistor Q1 at the first stage in the HPAIC1 is input to the PD1a, via the bonding wires BW, as illustrated in FIG. 5. Other various circuit components as shown in the mounting area AR1 in FIG. 5 are mounted and formed in the AR1_H. Each external terminal PN illustrated in FIG. 2 is provided on a rear surface of the module wiring substrate in FIG. 6, and each electrode illustrated in FIG. 6 is appropriately connected with the external terminal via the module wiring substrate.

In such a configuration example, one of the main characteristics of Embodiment 1 is that an internal electrode (internal pad) CPD (REF) on the control chip CTLIC and the electrode PD10 (GND) on the module wiring substrate are connected together by the bonding wire BW. The CPD (REF) corresponds to any one of the terminals REF1 to REF3 in FIG. 3 and FIG. 4. Further, in the example in FIG. 6, it is also one of the main characteristics that a shape of the PD10 (GND) corresponding to a connection point of the BW is in a shape partially protruded toward the X-axis direction. Accordingly, it is possible to secure a minimum necessary distance to perform connection between the CPD (REF) and the PD10 (GND) by the BW. That is, in order to reduce the size of the high-frequency power amplifier module, it is preferable to minimize the necessary area of the PD10 (GND). However, this has a risk that the connection by the BW is difficult due to a too short distance between the CPD (REF) and the PD10 (GND). This situation can be prevented by the shape of the PD10 (GND) in the example in FIG. 6.

Layout Configuration of the High-Frequency Power Amplifier Module [2]

Figure 7:
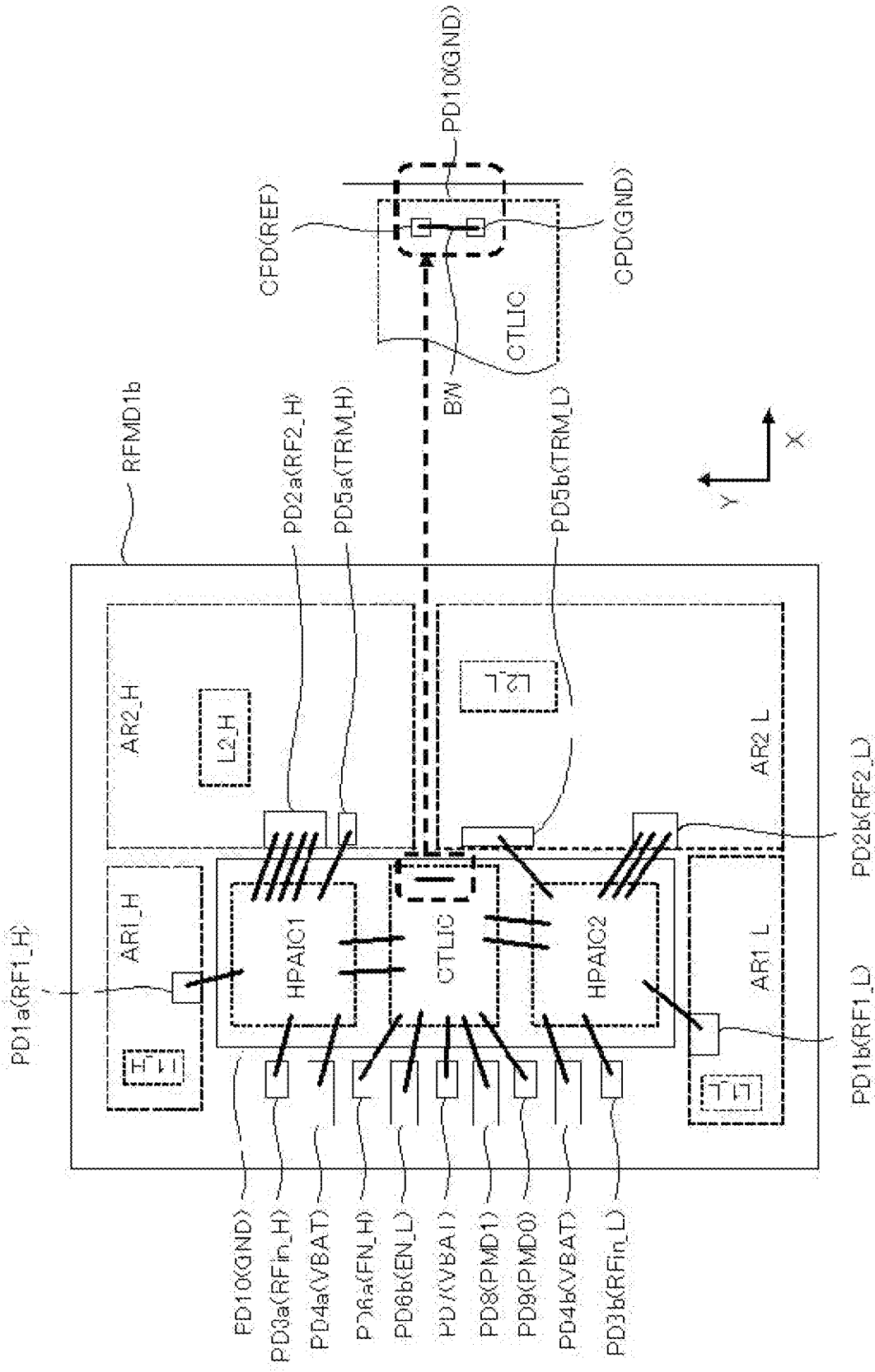
FIG. 7 is a plan view illustrating a schematic layout configuration example of the high-frequency power amplifier module in FIG. 2, as a modification of the high-frequency power amplifier module in FIG. 6.

FIG. 7 is a plan view illustrating a schematic layout configuration example of the high-frequency power amplifier module in FIG. 2, as a modification of the high-frequency power amplifier module in FIG. 6. As compared with the RFMD1a in FIG. 6, the high-frequency power amplifier module RFMD1b in FIG. 7 is different in mainly the configuration of the surrounding of the terminals REF1 to REF3 in the control chip CTLIC. That is, in the example in FIG. 7, the electrode PD10 (GND) on the module wiring substrate is configured by a minimum necessary area. At the same time, the internal electrode CPD (REF) corresponding to any one of the terminals REF1 to REF3 is connected by the bonding wire BW to the internal electrode CPD (GND) for the ground power supply voltage GND that is formed in the same semiconductor chip. For example, when it is possible to secure a minimum necessary distance to connect between the CPD (REF) and the CPD (GND) by the BW, the use of such a configuration is beneficial.

Method of Manufacturing the High-Frequency Power Amplifier Module

Figure 8:
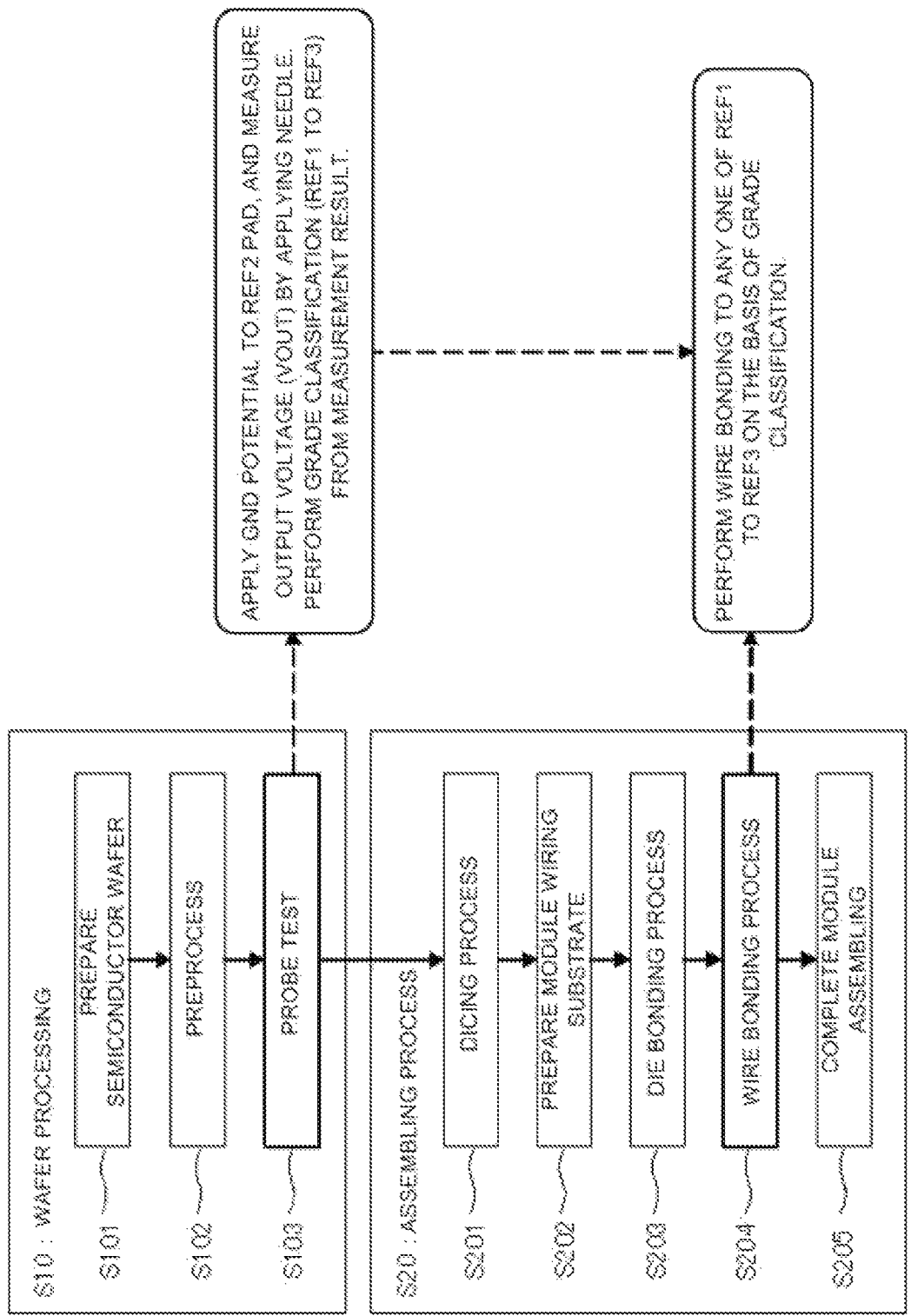
FIG. 8 is a flow diagram illustrating an example of a manufacturing method of the high-frequency power amplifier modules in FIG. 6 and FIG. 7.
Figures 9, 10:
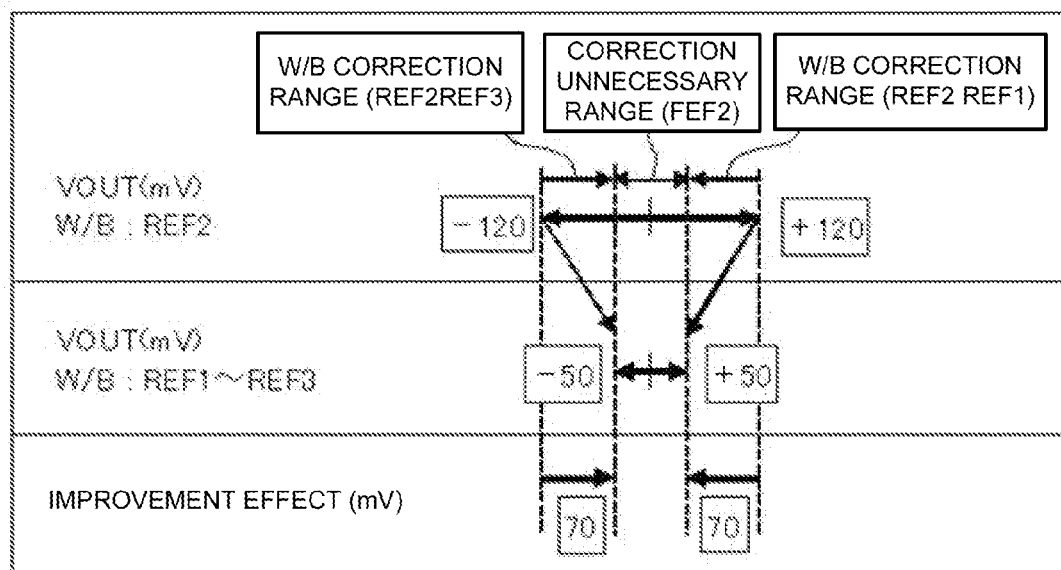
FIG. 9 is an explanatory diagram illustrating an example of a grade classification method at a probe test time in the flow in FIG. 8.
FIG. 10 is a conceptual diagram illustrating an example of an effect of using the manufacturing method in FIG. 8.

FIG. 8 is a flow diagram illustrating an example of a manufacturing method of the high-frequency power amplifier modules in FIG. 6 and FIG. 7. FIG. 9 is an explanatory diagram illustrating an example of a grade classification method at a probe test time in the flow in FIG. 8. In FIG. 8, first, a wafer process (S10) is performed, and then the assembly process (S20) is performed. In the wafer process (S10), first, a semiconductor wafer is prepared (S101), and a predetermined circuit is formed on the semiconductor wafer by a preprocess (S102). In the examples in FIG. 6 and FIG. 7, the high-frequency power amplifier chip HPAIC1, the high-frequency power amplifier chip HPAIC2, and the control chip CTLIC are manufactured by using mutually different semiconductor wafers. Then, a probe test is performed to the semiconductor wafers (S103).

In step S103, a probe test device operates in each circuit in FIG. 4 for each CTLIC by targeting a semiconductor wafer on which the control chip CTLIC is formed, and measures the output voltage of the output voltage terminal VOUT in a state that the ground power supply voltage GND is supplied to the terminal REF2 in FIG. 4 via the probe. At this time, the probe test device controls the CTLIC so that at least one of predetermined switches is turned ON out of the switches in the power switch block PSWBK. In practice, the output voltage terminal VOUT becomes one of the terminals for the bias control signals VCNT1_H, VCNT2_H, VCNT1_L, and VCNT2_L in FIG. 3.

Each control chip CTLIC on the semiconductor wafer is grade-classified as illustrated in FIG. 9, for example, on the basis of a measurement result of the output voltage (VOUT). In FIG. 9, the CTLIC the output voltage (VOUT) of which is lower than 2.85 V is classified into Grade A (GrA), and a destination of the ground power supply voltage GND is determined as the terminal REF3. The CTLIC of which the output voltage (VOUT) is in the range of 2.85 V to 2.95 V is classified into Grade B (GrB), and a connection destination of the GND is determined as the terminal REF2. The CTLIC of which the output voltage (VOUT) is higher than 2.95 V is classified into Grade C (GrC), and a connection destination of the GND is determined as the terminal REF1.

Subsequently, in an assembly process (S20), first, a dicing process of dividing each semiconductor chip from each semiconductor wafer is performed (S201). Next, after a module wiring substrate is prepared (S202), each semiconductor chip (HPAIC1, HPAIC2, and CTLIC) is mounted (die bonding) on the module wiring substrate (S203). Subsequently, wiring bonding between the semiconductor chips and between each semiconductor chip and the module wiring substrate is performed (S204). At this time, the terminals REF1 to REF3 in the control chip CTLIC are wire-bonded on the basis of a grade classification result of the CTLIC described with reference to FIG. 9 (S205).

Specific Examples of the Effect of an Present Embodiment

FIG. 10 is a conceptual diagram illustrating an example of an effect of using the manufacturing method in FIG. 8. As illustrated in FIG. 10, when each circuit in FIG. 4 is operated by fixing the terminal REF2 in FIG. 4 to the ground power supply voltage GND, for example, there is a case of the occurrence of a variation of about ±120 mV between the semiconductor chips, in the output voltage (VOUT), due to mainly variations in the bandgap voltage Vbg. Therefore, when a variation amount is within ±50 mV of a target value, correction is not necessary (that is, the REF2 is connected to the GND), and when a variation amount exceeds ±50 mV, correction is necessary.

When a variation amount is −120 mV, for example, correction of about +70 mV can be performed by connecting the terminal REF3 instead of the terminal REF2 to the GND, and as a result, the variation amount can be suppressed to about −50 mV. Conversely, when a variation amount is +120 mV, for example, correction of about −70 mV can be performed by connecting the terminal REF1 instead of the terminal REF2 to the GND, and as a result, the variation amount can be suppressed to about +50 mV. Further, when a variation amount is −60 mV, for example, correction of about +70 mV can be performed by connecting the terminal REF3 instead of the terminal REF2 to the GND, and as a result, the variation amount can be suppressed to about +10 mV. As a result, a variation amount of the output voltage (VOUT) of each semiconductor chip can be suppressed to about ±50 mV from the target value.

As described above, by using the semiconductor integrated circuit device and the high-frequency power amplifier module according to Embodiment 1, representatively, variations in transmission power characteristics can be reduced. Although correction was performed by using the three terminals REF1 to REF3 in this example, the number is not limited to three, and four or more terminals can be also provided in a similar manner. In this case, although there is a risk of a slight increase in a circuit area, the amount of variations in the reference voltage can be further suppressed.

Embodiment 2

Detailed Configuration of the Reference-Voltage Correction Circuit (Modification [1])

Figure 11:
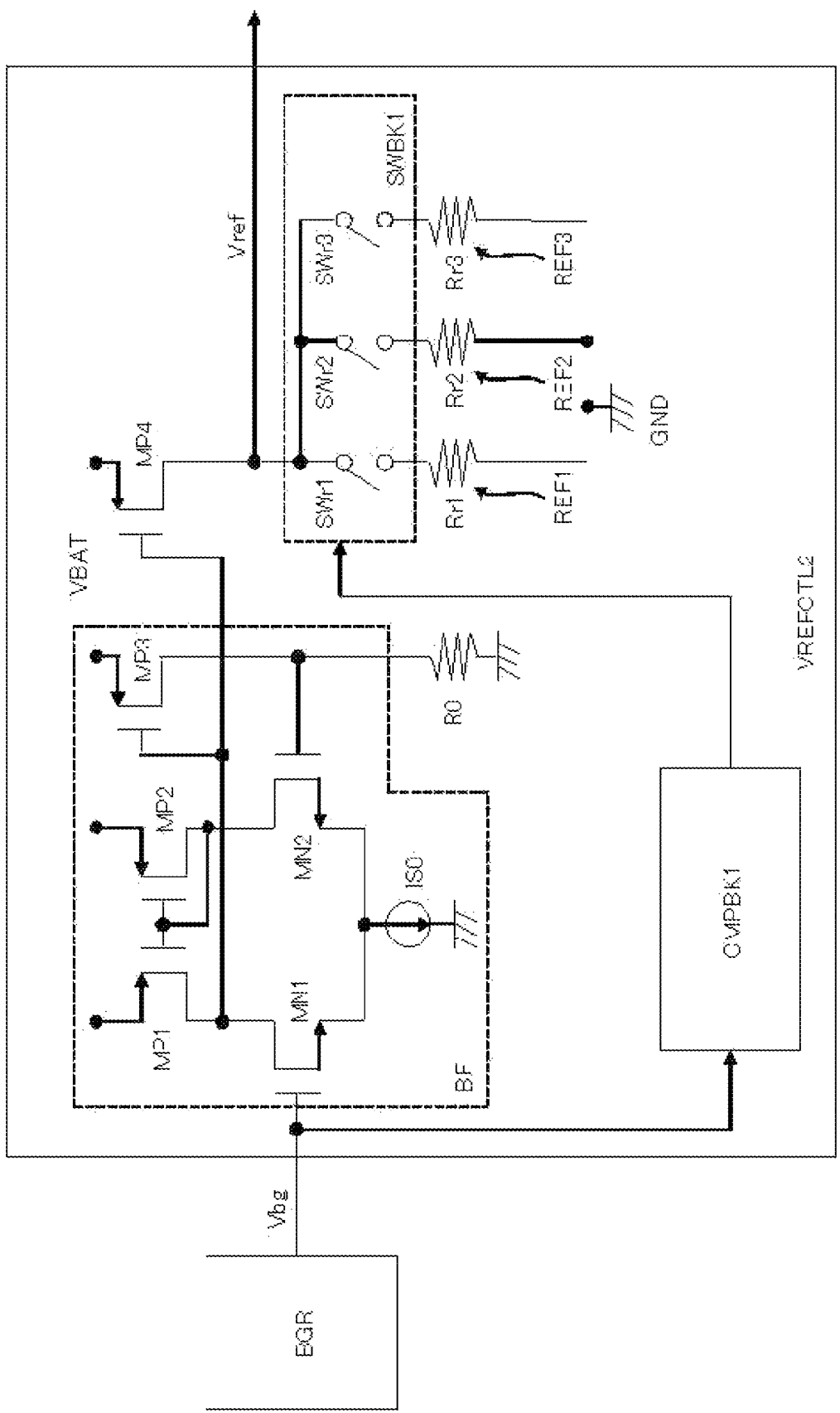
FIG. 11 is a circuit diagram illustrating a detailed configuration example of a reference-voltage correction circuit in a control chip included in a high-frequency power amplifier module according to Embodiment 2 of the present invention.

FIG. 11 is a circuit diagram illustrating a detailed configuration example of a reference-voltage correction circuit in a control chip included in a high-frequency power amplifier module according to Embodiment 2 of the present invention. A reference-voltage correction circuit VREFCTL2 illustrated in FIG. 11 Is a modification of the VREFCTL1 in FIG. 4, and includes a comparator circuit block CMPBK1 and the switch block SWBK1, in addition to the unity gain buffer BF, the PMOS transistor MP4, the resistors R0, and Rr1 to Rr3 that are similar to those in FIG. 4.

The switch block SWBK1 includes switches SWr1 to SWr3. The SWr1 is connected between the drain of the PMOS transistor MP4 and one end of the resistor Rr1, the SWr2 is connected between the drain of the MP4 and one end of the resistor Rr2, and the SWr3 is connected between the drain of the MP4 and one end of the resistor Rr3. The other ends of the Rr1 to Rr3 are connected to the ground power supply voltage GND. ON and OFF of the SWr1 to SWr3 is controlled by CMPBK1. In this way, the reference-voltage correction circuit VREFCTL2 in FIG. 11 is different from the correction system of the VREFCTL1 in FIG. 4 (system that selects a wire bonding destination of the terminals REF1 to REF3), and is a system that performs correction on the basis of selection of the switches SWr1 to SWr3.

Figure 12:
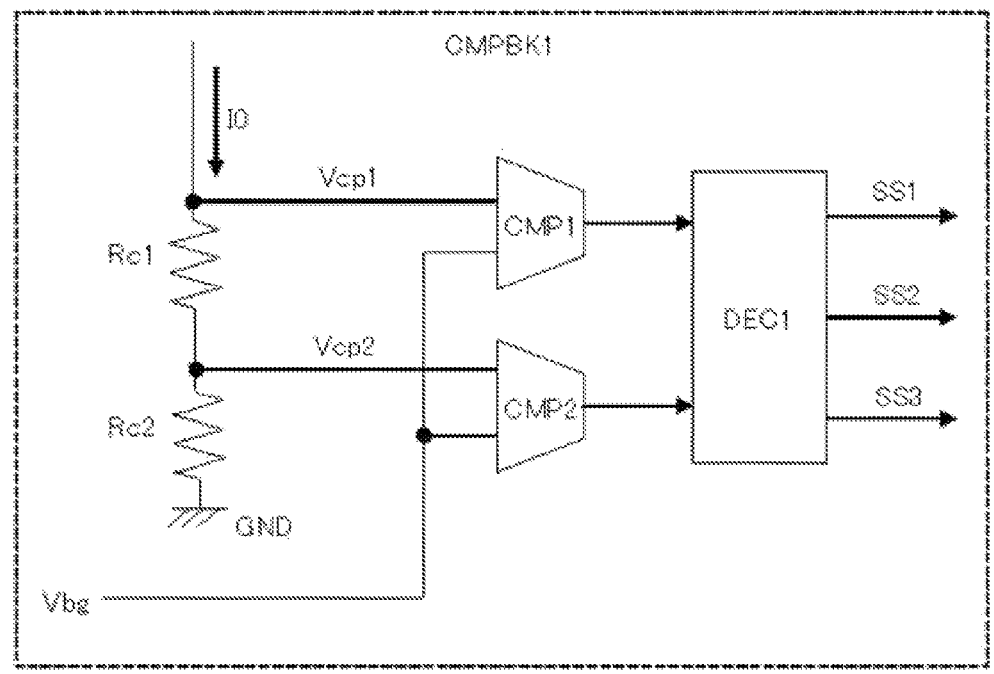
FIG. 12 is a circuit diagram illustrating a detailed configuration example of a comparator circuit block in the reference-voltage correction circuit in FIG. 11.

FIG. 12 is a circuit diagram illustrating a detailed configuration example of the comparator circuit block in the reference-voltage correction circuit in FIG. 11. The comparator circuit block CMPBK1 illustrated in FIG. 12 includes series-connected resistors Rc1 and Rc2 to which a constant current I0 is supplied, comparator circuits CMP1 and CMP2, and a decoder circuit DEC1. A comparison voltage Vcp1 of (I0×(Rd+Rc2)) is generated from one end of the Rc1, and a comparison voltage Vcp2 of (I0×Rc2) is generated from one end of the Rc2. The CMP1 determines the bandgap voltage Vbg from the bandgap reference circuit BGR in FIG. 4 on the basis of the Vcp1, and the CMP2 determines the Vbg on the basis of the Vcp2. The DEC1 generates ON/OFF control signals SS1 to SS3 to the switches SWr1 to SWr3 in FIG. 11 according to determination results of the CMP1 and CMP2.

Figure 13:
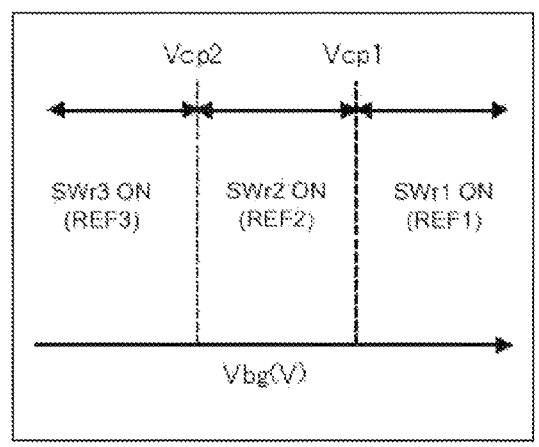
FIG. 13 is an explanatory diagram illustrating an operation example of the comparator circuit block in FIG. 12.

FIG. 13 is an explanatory diagram illustrating an operation example of the comparator circuit block in FIG. 12. As illustrated in FIG. 13, the comparator circuit block CMPBK1 (decoder circuit DEC1) activates the ON/OFF control signal SS2 (controls to turn ON the switch SWr2 in FIG. 11), when the bandgap voltage Vbg is in the range from the comparison voltage Vcp2 to the comparison voltage Vcp1. Further, the CMPBK1 (DEC1) activates the ON/OFF control signal SS1 (controls to turn ON the switch SWr1 in FIG. 11), when the Vbg is larger than the Vcp1, and activates the ON/OFF control signal SS3 (controls to turn ON the switch SWr3 in FIG. 11), when the Vbg is smaller than the Vcp2.

The ON control of the switches SWr1 to SWr3 is functionally equal to the connection of the terminals REF1 to REF3 in FIG. 4 to the ground power supply voltage GND. As a result, the same effect as that in Embodiment 1 is obtained. As compared with Embodiment 1, the wire bonding process associated with the terminals REF1 to REF3 is not used, and further, the grade classification as illustrated in FIG. 9 can be automatically performed by the comparator circuit block. Therefore, there is a case that simplification of a manufacturing flow (reduction in manufacturing cost) and miniaturization of a module wiring substrate can be performed. However, there is a risk that a chip area increases (chip cost increases) due to the addition of the comparator circuit block and the switch block, and a risk that the accuracy of the comparator circuit block itself becomes a problem.

Embodiment 3

Detailed Configuration of the Reference-Voltage Correction Circuit (Modification [2])

Figure 14:
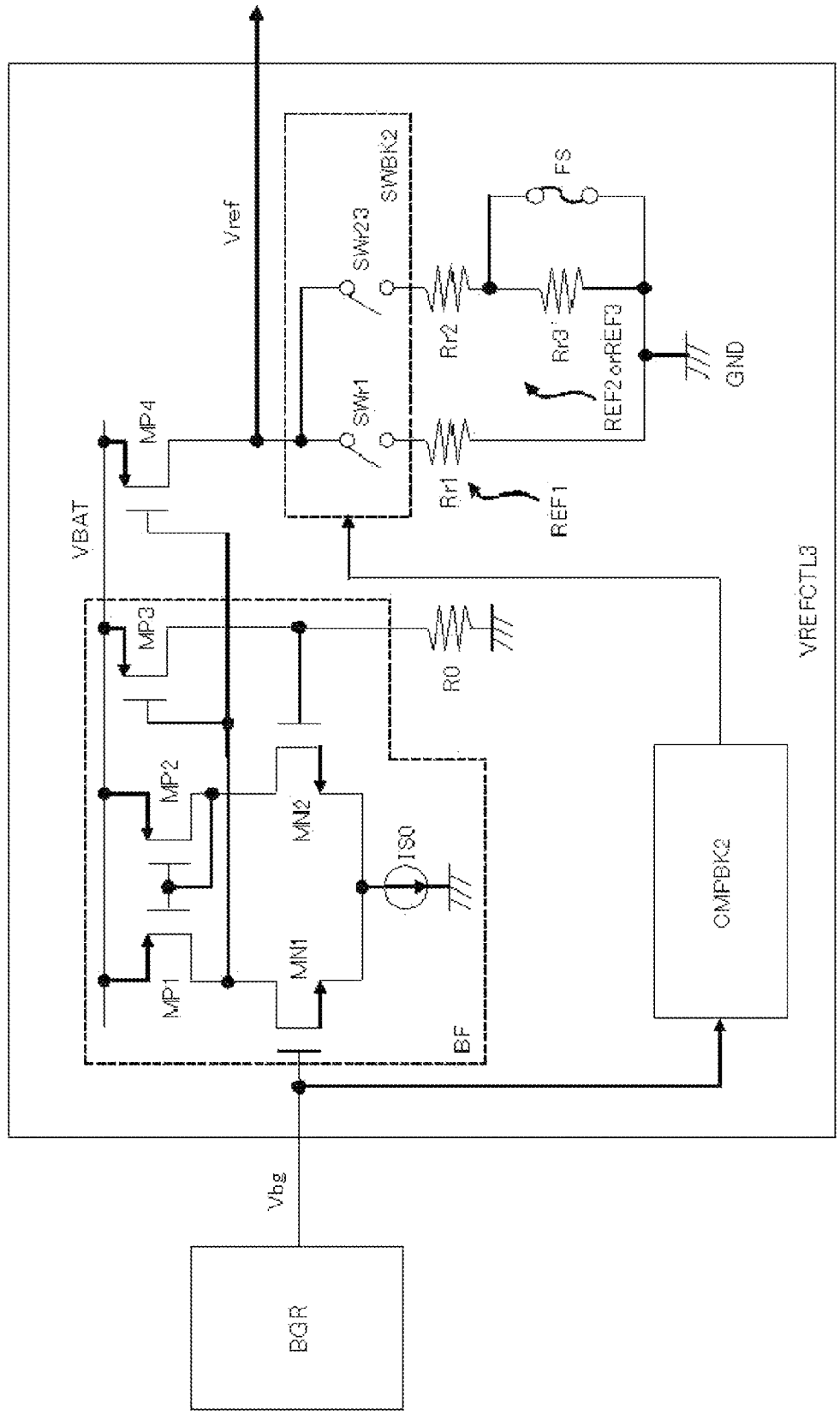
FIG. 14 is a circuit diagram illustrating a detailed configuration example of a reference-voltage correction circuit in a control chip included in a high-frequency power amplifier module according to Embodiment 3 of the present invention.

FIG. 14 is a circuit diagram illustrating a detailed configuration example of a reference-voltage correction circuit in a control chip included in a high-frequency power amplifier module according to Embodiment 3 of the present invention. A reference-voltage correction circuit VREFCTL3 illustrated in FIG. 14 is a modification of the VREFCTL1 in FIG. 4, and includes a comparator circuit block CMPBK2, a switch block SWBK2, a resistor Rr3', and a fuse FS, in addition to the unity gain buffer BF, the PMOS transistor MP4, the resistors R0, and Rr1, and Rr2 that are similar to those in FIG. 4.

The switch block SWBK2 includes switches SWr1 and SWr23. The SWr1 is connected between the drain of the PMOS transistor MP4 and one end of the resistor Rr1, and the SWr23 is connected between the drain of the MP4 and one end of the resistor Rr2. The other end of the Rr1 is connected to the ground power supply voltage GND, and the other end of the Rr2 is connected to the ground power supply voltage GND via the resistor Rr3' and the fuse FS that are connected in parallel. In this way, the reference-voltage correction circuit VREFCTL3 in FIG. 14 is different from the correction system of the VREFCTL1 in FIG. 4 (system that selects a wire bonding destination of the terminals REF1 to REF3), and is a system that performs correction on the basis of a combination of selection of the switches SWr1 and SWr23, and the fuse FS.

Figure 15:
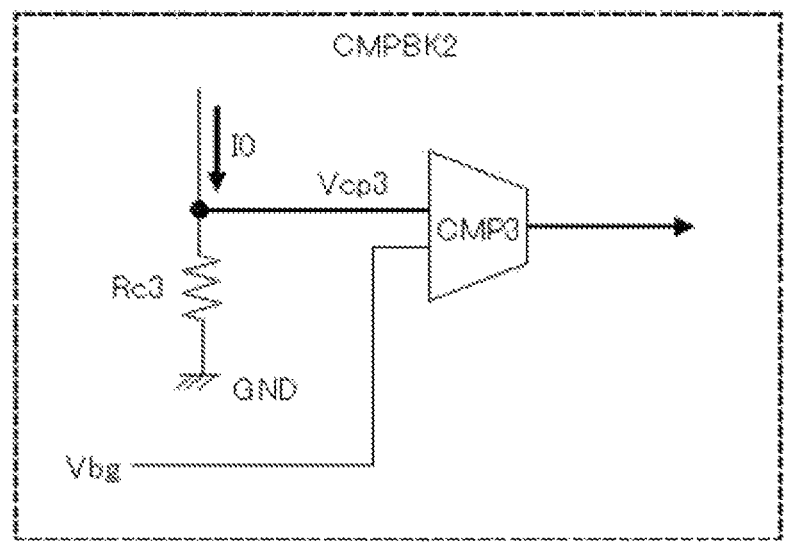
FIG. 15 is a circuit diagram illustrating a detailed configuration example of a comparator circuit block in the reference-voltage correction circuit in FIG. 14.

FIG. 15 is a circuit diagram illustrating a detailed configuration example of a comparator circuit block in the reference-voltage correction circuit in FIG. 14. The comparator circuit block CMPBK2 illustrated in FIG. 15 includes a resistor Rc3 to which the constant current I0 is supplied, and a comparator circuit CMP3. A comparison voltage Vcp3 of (I0×Rc3) is generated from one end of the Rc3. The CMP3 determines the bandgap voltage Vbg from the bandgap reference circuit BGR in FIG. 14, on the basis of the Vcp3, and controls ON/OFF of the switches SWr1 and SWr23 in FIG. 14.

Figure 16:
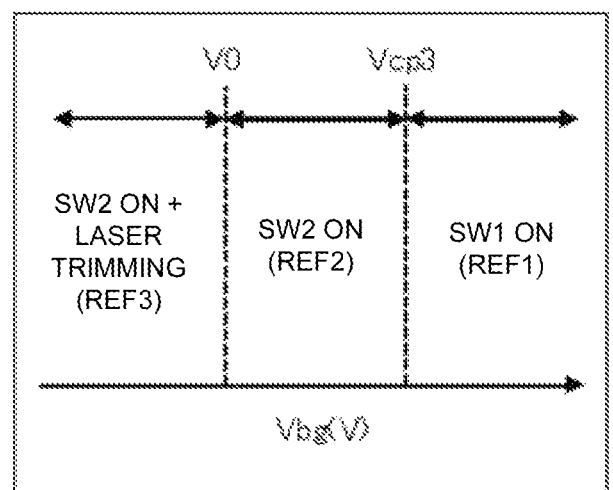
FIG. 16 is an explanatory diagram illustrating an example of a correction method including an operation example of the comparator circuit block in FIG. 15.

FIG. 16 is an explanatory diagram illustrating an example of a correction method including an operation example of the comparator circuit block in FIG. 15. As illustrated in FIG. 16, the comparator circuit block CMPBK2 controls to turn ON the switch SWr1 in FIG. 14 when the bandgap voltage Vbg is larger than the comparison voltage Vcp3, and controls to turn ON the switch SWr23 in FIG. 14 when the Vbg is equal to or smaller than the Vcp3. Further, in a state that the SWr1 and SWr23 are controlled by the CMPBK2, the output voltage of the output voltage terminal VOUT is measured by using a probe test device, and the bandgap voltage Vbg is calculated from the output voltage of the output voltage terminal VOUT, in a similar manner to that of Embodiment 1 (FIG. 8 and the like). As a result, as illustrated in FIG. 16, when the output voltage (VOUT) is higher than a predetermined comparison voltage V0, the fuse FS in FIG. 14 is left as it is, and when the output voltage (VOUT) is equal to or lower than V0, the FS is disconnected by laser trimming.

In FIG. 14, in the ON state of the switch SWr23, when the fuse FS is intact, the resistor Rr2 is connected between the drain of the PMOS transistor MP4 and the ground power supply voltage GND. When the FS is disconnected, the resistor Rr2 and the resistor Rr3' are connected in series between the drain of the MP4 and the GND. Therefore, when a resistance value of the resistor Rr3' is set to become Rr2+Rr3'=Rr3, (see FIG. 4 for Rr3), a correction function similar to that in FIG. 4 can be realized.

In this way, by using the high-frequency power amplifier module according to Embodiment 3, the effect similar to those in Embodiment 1 and Embodiment 2 can be obtained. Compared to Embodiment 1, the wire bonding process associated with the terminals REF1 to REF3 is not used, and further, a part of the grade classification as illustrated in FIG. 9 can be automatically performed by the comparator circuit block. Therefore, there is a case of being able to achieve simplification of a manufacturing flow (reduction in manufacturing cost) and miniaturization of a module wiring substrate. However, there is a risk of increase in a chip area (chip cost increases) due to the addition of the comparator circuit block, the switch block, and the fuse, and there is also a risk that the accuracy of the comparator circuit block itself becomes a problem.

Further, compared to Embodiment 2, in place of addition of the fuse, there is a case of being able to reduce circuit areas of the comparator circuit block and the switch block, and being able to reduce the chip area (chip cost) accordingly. However, because a laser trimming process of the fuse is used, there is a risk of increase in manufacturing cost.

Embodiment 4

Detailed Configuration of the Reference-Voltage Correction Circuit (Modification [3])

Figure 17:
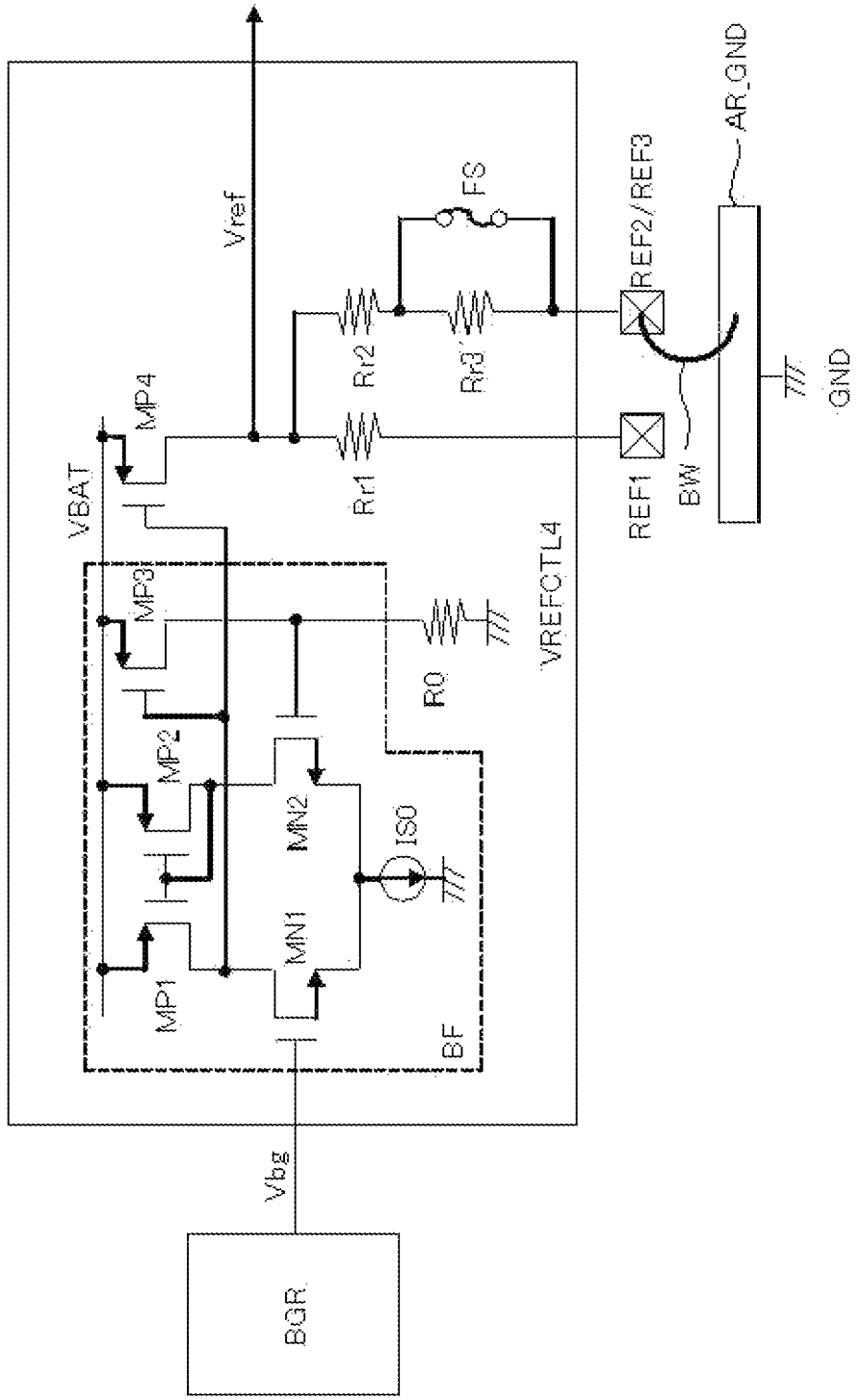
FIG. 17 is a circuit diagram illustrating a detailed configuration example of a reference-voltage correction circuit in a control chip included in a high-frequency power amplifier module according to Embodiment 4 of the present invention.

FIG. 17 is a circuit diagram illustrating a detailed configuration example of a reference-voltage correction circuit in a control chip included in a high-frequency power amplifier module according to Embodiment 4 of the present invention. A reference-voltage correction circuit VREFCTL4 illustrated in FIG. 17 is a configuration example of a combination of the reference-voltage correction circuit VREFCTL1 FIG. 4 and the system of the fuse FS described with reference to FIG. 14. When using such a configuration example, first, grade classification is performed by a probe test as described in Embodiment 1 (FIG. 8, FIG. 9 and the like). In the case of the grade C (GrC) in FIG. 9, the terminal REF1 is wire-bonded to the ground power supply voltage GND. In the case of the grade B (GrB), the terminals REF2/REF3 are wire-bonded to the GND without disconnecting the FS. In the case of the grade A (GrA), the FS is disconnected, and the terminals REF2/REF3 are also wire-bonded to the GND.

When such a configuration example is used, as compared with the case of Embodiment 1 (FIG. 4), there is a risk of increase in manufacturing cost due to the addition of a laser trimming process. However, there is a case that a circuit area (chip cost) can be reduced by decreasing an external terminal.

Embodiment 5

Total Configuration of the High-Frequency Power Amplifier Module (Modification)

Figure 18A:
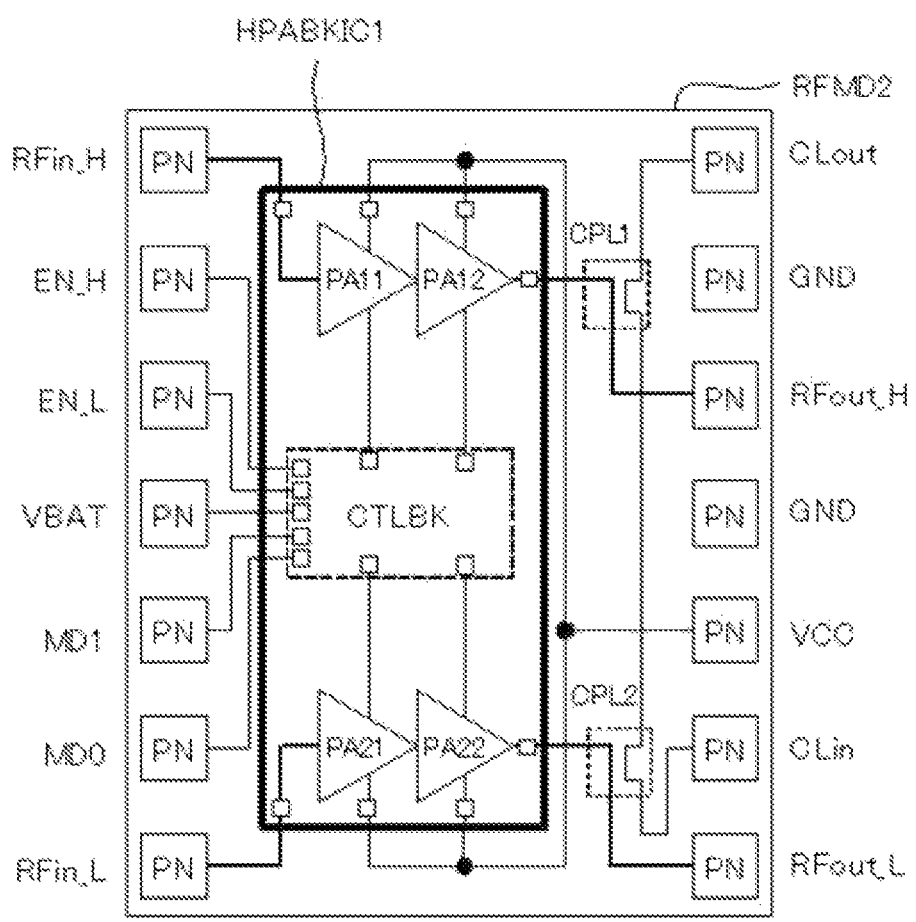
FIG. 18A is a total block diagram illustrating a schematic configuration example of a high-frequency power amplifier module as a whole according to Embodiment 5 of the present invention.
Figure 18B:
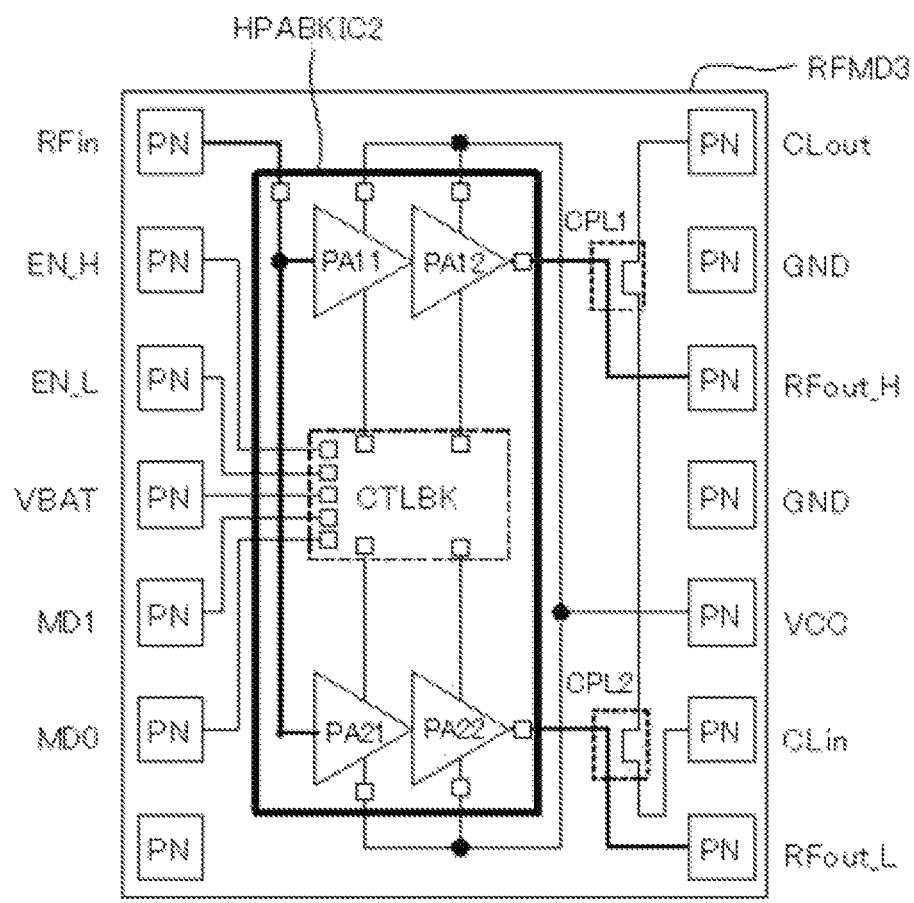
FIG. 18B is a total block diagram illustrating a schematic configuration example of a high-frequency power amplifier module as a whole according to Embodiment 5 of the present invention.

FIG. 18A and FIG. 18B are total block diagrams illustrating schematic configuration examples of a high-frequency power amplifier module as a whole according to Embodiment 5 of the present invention. A high-frequency power amplifier module RFMD2 illustrated in FIG. 18A is a modification of the RFMD1 in FIG. 2, and is different from the RFMD1 in FIG. 2 in that the power amplifier circuits PA11, PA12, PA21, and PA22 and the control block CTLBK are formed in one semiconductor chip (high-frequency power amplifier control chip HPABKIC1). When each power amplifier circuit can be realized by an LDMOS (Laterally Diffused MOS) and the like, for example, the circuits can be integrated into one semiconductor chip including the control chip in this way. As a result, further miniaturization and cost reduction of the high-frequency power amplifier module become possible.

A high-frequency power amplifier module RFMD3 illustrated in FIG. 18B is a modification of the RFMD2 in FIG. 18A. The RFMD3 in FIG. 18B is different from the RFMD2 in FIG. 18A in that the power amplifier circuits PA11 and PA12 for high band and the power amplifier circuits PA21 and PA22 for low band in the power amplifier control chip HPABKIC2 share the external terminals PN (RFin) for the high-frequency input signal RFin. Accordingly, reduction of external terminals becomes possible, and further miniaturization and cost reduction of the high-frequency power amplifier module become possible.

Details of the High-Frequency Power Amplifier Control Chip

Figure 19:
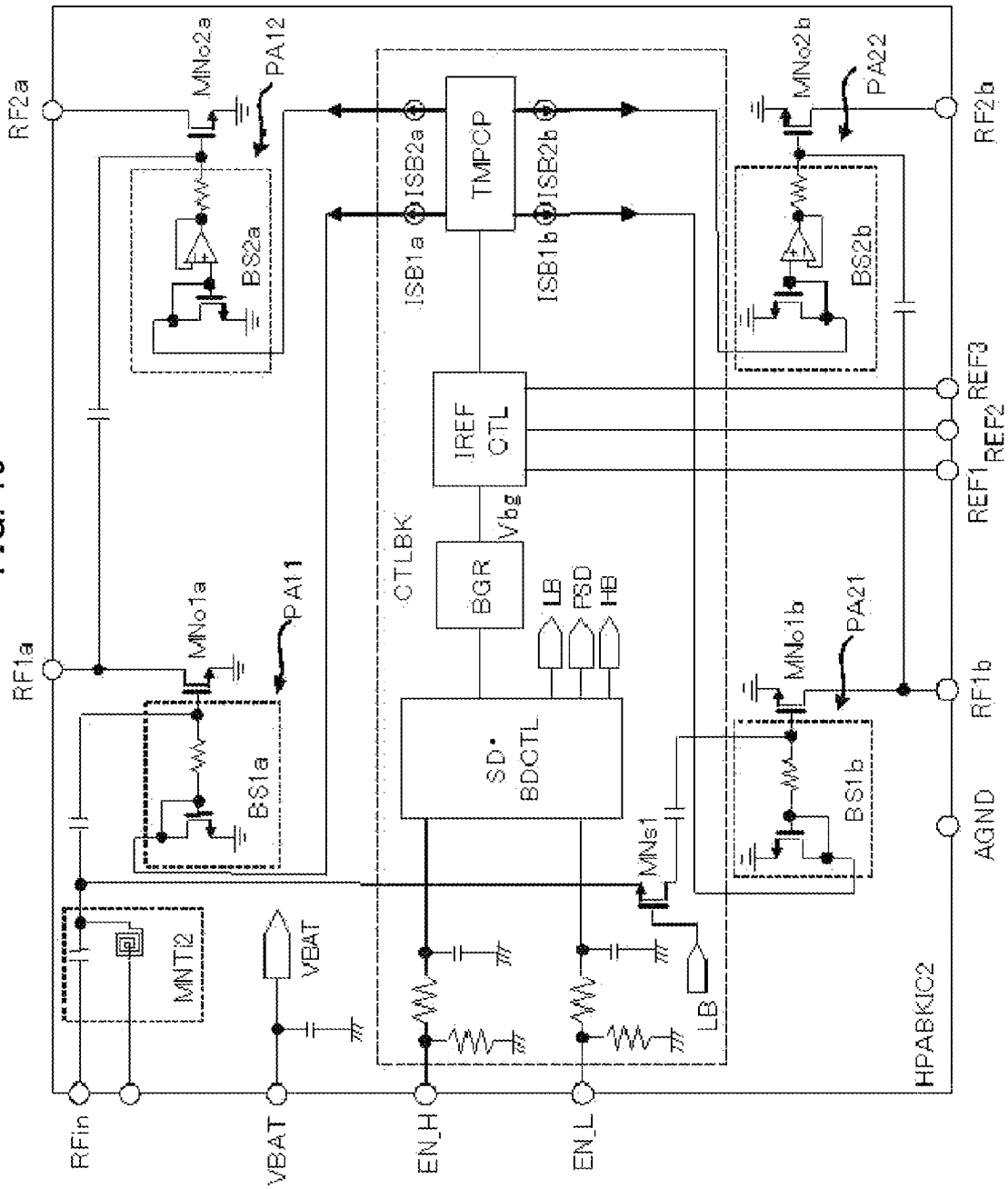
FIG. 19 is a circuit diagram illustrating a detailed configuration example of a high-frequency power amplifier control chip in the high-frequency power amplifier module in FIG. 18B.

FIG. 19 is a circuit diagram illustrating a detailed configuration example of the high-frequency power amplifier control chip in the high-frequency power amplifier module in FIG. 18B. The high-frequency power amplifier control chip HPABKIC2 illustrated in FIG. 19 includes an input matching circuit MNTi2, source-ground amplifying NMOS transistors MNo1a, MNo2a, MNo1b, and MNo2b, bias circuits BS1a, BS2a, BS1b, and BS2b, and the control block CTLBK. The MNo1a, the MNo2a, the MNo1b, and the MNo2b are realized by the LDMOS and the like, for example. The MNo1a is for a first stage of the high band, the MNo2b is for a latter band of the high band, the MNo1b is for a first stage of the low band, and the MNo2a is for a later stage of the low band.

The CTLBK includes a shutdown band control circuit SD·BDCTL, a bandgap reference circuit BGR, a reference-current generation and correction circuit IREFCTL, a temperature correction circuit TMPCP, bias current sources ISB1a, ISB2a, ISB1b, and ISB2b, and a switch NMOS transistor MNs1. The shutdown band control circuit SD·BDCTL outputs the low-band selection signal LB or the high-band selection signal HB according to the band selection signals EN_H and EN_L, or outputs a shutdown signal PSD for shifting the control chip CTLIC as a whole to a shutdown mode, in a similar manner to that in FIG. 3. The bandgap reference circuit BGR is deactivated when generating the shutdown signal PSD, and is activated and generates the bandgap voltage Vbg when generating the low-band selection signal LBa or the high-band selection signal HB, in a similar manner to that in FIG. 3.

The reference-current generation and correction circuit IREFCTL, which will be described in detail later, performs correction of the bandgap voltage Vbg like the reference-voltage correction circuit VREFCTL in FIG. 3, and others. However, unlike the case in FIG. 3 and others, the reference-current generation and correction circuit IREFCTL generates a reference current (bias current) that reflects a correction results together with correction of the Vbg. The bias current is used in the bias current sources ISB1a, ISB2a, ISB1b, and ISB2b. The temperature correction circuit TMPCP appropriately performs temperature correction for the bias currents generated by the ISB1a, ISB2a, ISB1b, and ISB2b. That is, the TMPCP appropriately controls increase or decrease of the bias currents, to reduce temperature dependency of the gain in the amplifying NMOS transistors MNo1a, MNo2a, MNo1b, and MNo2b.

The bias circuit BS1a configures a current mirror circuit with the amplifying NMOS transistor MNo1a, and includes the NMOS transistors to the drains of which a bias current from the bias current source ISB1a is supplied, and a resistor element (high-resistance element) that connects between the gates of the NMOS transistors. Accordingly, a bias current that reflects a mirror ratio of the current mirror circuit in the bias current is supplied to between the source and the drain of the MNo1a. The high-frequency input signal RFin is further input to the gate of the MNo1a, via the input matching circuit MNTi2 and the AC coupling capacitor. In this case, the MNTi2 is configured by a capacitor, a spiral inductor, and the like. The resistor element in the BS1a is for reducing wraparound of the RFin to the NMOS transistors in the BS1a.

The bias circuit BS2a configures a current mirror circuit with the amplifying NMOS transistor MNo2a, and includes the NMOS transistors to the drains of which a bias current from the bias current source ISB2a is supplied, and a voltage follower circuit and a resistor element (high resistor element) that connect between the gates of the NMOS transistors. Accordingly, a bias current that reflects a mirror ratio of the current mirror circuit in the bias current is supplied to between the source and the drain of the MNo2a. The drain of the amplifying NMOS transistor MNo1a is further input to the gate of the MNo2a, via the AC coupling capacitor. The resistor element in the BS2a is for reducing wraparound of the high frequency signal, as in the case of the BS1a. The voltage follower circuit is for performing impedance conversion. Usually, because a transistor size of the MNo2a is much larger than that of the MNo1a, the voltage follower circuit is used in only the bias circuit at the later stage side in this case.

The bias circuit BS1b includes a configuration similar to that of the BS1a, and is provided corresponding to the amplifying NMOS transistor MNo1b, and the bias circuit BS2b includes a configuration similar to that of the BS2a, and is provided corresponding to the amplifying NMOS transistor MNo2b. However, in this case, because the MNo1a and MNo1b share the high-frequency input signal RFin, the RFin is input to the gate of the MNo1b via the input matching circuit MNTi2, the switching NMOS transistor MNs1, and the AC coupling capacitor. The power supply voltage is appropriately supplied to drain terminals RF1a and RF1b of the MNo1a and MNo1b, as in the case of FIG. 5, and the power supply voltage is appropriately supplied to drain terminals RF2a and RF2b of the MNo2a and MNo2b, as in the case of FIG. 5.

In such a configuration example, when operating in the high band (when the high-band selection signal HB is activated), for example, the switching NMOS transistor MNs1 is controlled to be turned OFF, and supply of the bias current from the bias current sources ISB1b and ISB2b for the low band is controlled to a stop state (bias current is zero, for example). Accordingly, the high-frequency input signal RFin is amplified via the amplifying NMOS transistors MNo1a and MNo2a for the high band. On the other hand, when operating in the low band (when the low-band selection signal LB is activated), for example, the MNs1 is controlled to be turned ON, and supply of the bias current from the bias current sources ISB1a and ISB2a for the high band is controlled to a stop state (bias current is zero, for example). Accordingly, the RFin is amplified via the amplifying NMOS transistors MNo1b and MNo2b for the low band.

Figure 20:
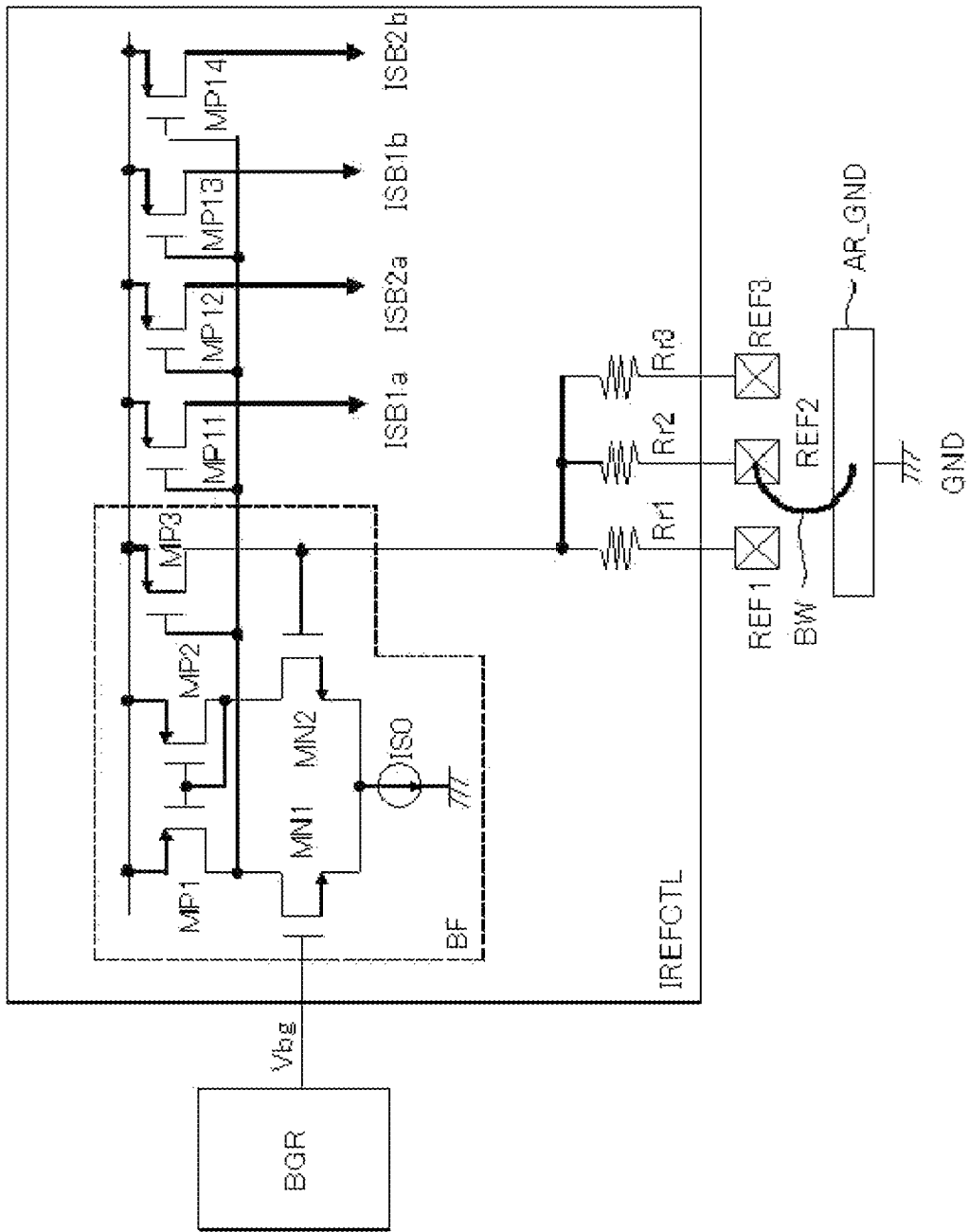
FIG. 20 is a circuit diagram illustrating a detailed configuration example of the surrounding of a reference-current generation and correction circuit in the high-frequency power amplifier control chip in FIG. 19.

Details of the Surrounding of the Reference-Current Generation and Correction Circuit FIG. 20 is a circuit diagram illustrating a detailed configuration example of the surrounding of the reference-current generation and correction circuit in the high-frequency power amplifier control chip in FIG. 19. The reference-current generation and correction circuit IREFCTL illustrated in FIG. 20 includes the resistors Rr1 to Rr3 and PMOS transistors MP11 to MP14, in addition to the unity gain buffer BF similar to that of the reference-voltage correction circuit VREFCTL1 in FIG. 4 described above. The BF receives the bandgap voltage Vbg from the bandgap reference circuit BGR, and outputs the Vbg to the drain of the PMOS transistor MP3 in the BF. One end of resistors Rr1 to Rr3 is connected at a common node to the drain of the MP3, and the other ends are connected to the terminals REF1 to REF3, respectively.

As in the case of FIG. 4 and others, any one of the terminals REF1 to REF3 is connected to the mounting area AR_GND of the ground power supply voltage GND via the bonding wire BW. Accordingly, when the REF2 is connected to the AR_GND, for example, the current that is determined by (Vbg/Rr2) flows between the source and the drain of the PMOS transistor MP3. The PMOS transistors MP11 to MP14 respectively configure current mirror circuit with the MP3. Accordingly, currents according to a transistor size ratio with the MP3 are generated between the source and the drain of the MP11 to MP14. In the present example, the current from the MP11 is used in the bias current source ISB1$a$, the current from the MP12 is used in the bias current source ISB2$a$, the current from the MP13 is used in the bias current source ISB1$b$, and the current from the MP14 is used in the bias current source ISB2$b$.

When such a configuration is used, variations in the reference current (bias current) can be reduced, and effects similar to those in the case of Embodiment 1 can be obtained, in a similar manner to that of the reference voltage (bias current) in Embodiment 1. In FIG. 19, there is illustrated a circuit configuration example for the case that the high band and the low band share the RFin corresponding to FIG. 18B. When the high band and the low band do not share the RFin as in the case of FIG. 18A, the gate of the MNo1$b$ in FIG. 19 is configured to be connected to the outside of the chip via an input matching circuit that is different from the AC coupling capacitor and the MNTi2, for example. Further, the reference-current generation and correction circuit IREFCTL illustrated in FIG. 20 can be also changed, as appropriate, in the same manner as in Embodiments 2 to 4.

Embodiment 6

Total configuration of a Mobile Phone System (Wireless Communication Systems) (Modification)

Figure 21:
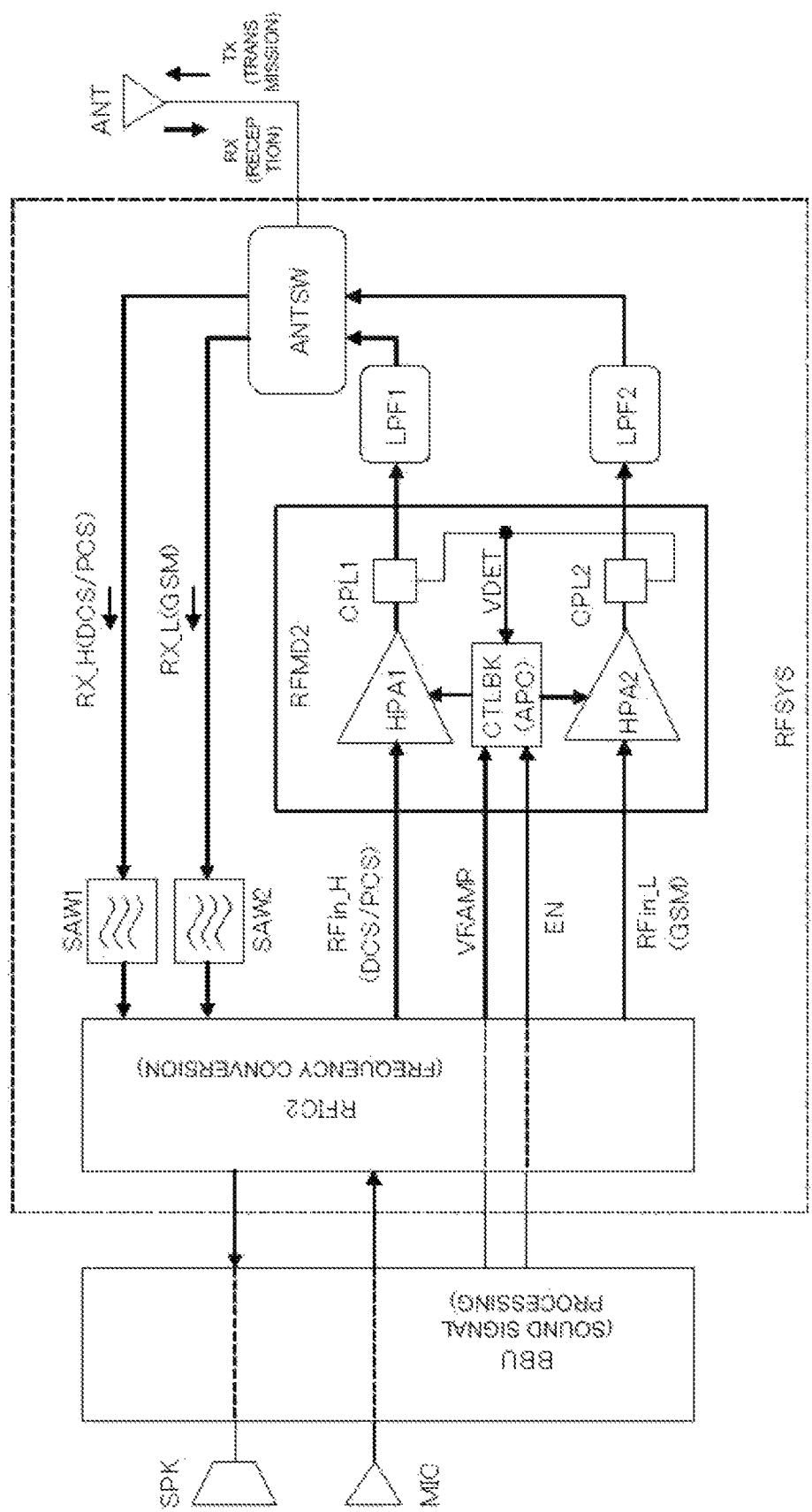
FIG. 21 is a block diagram illustrating a configuration example of a mobile phone system to which reduction of variations in the transmission characteristics is applied in a wireless communication system according to Embodiment 6 of the present invention.

FIG. 21 is a block diagram illustrating a configuration example of a mobile phone system to which reduction of variations in the transmission characteristics is applied in a wireless communication system according to Embodiment 6 of the present invention. The mobile phone system in FIG. 21 is a modification of the case in FIG. 1 described above. In the mobile phone system illustrated in FIG. 21, as compared with the configuration example in FIG. 1, mainly, the RFIC1 and RFMD1 in FIG. 1 are configured to be changed respectively to a high-frequency signal processing device RFIC2 and a high-frequency power amplifier module RFMD2 in FIG. 21, and the ANTSW/DPX in FIG. 1 are changed to the antenna switch ANTSW. In the present example, description will be made by focusing attention on a main difference from the configuration example in FIG. 1. The RFIC2 and RFMD2 are for the high band/low band of GSM (Global System for Mobile Communications) (registered trademark), differently from the RFIC1 and RFMD1 in FIG. 1 that are for the high band/low band of the W-CDMA (or the LTE).

Although not particularly limited, the low band of the GSM is GSM850 having a transmission frequency band of 824 MHz to 849 MHz and a reception frequency band of 869 MHz to 894 MHz, GSM900 having a transmission frequency band of 880 MHz to 915 MHz and a reception frequency band of 925 MHz to 960 MHz, and the like. The high band of the GSM is DCS (Digital Cellular System) 1800 having a transmission frequency band of 1710 MHz to 1785 MHz and a reception frequency band of 1805 MHz to 1880 MHz, PCS (Personal Communications Service) 1900 having a transmission frequency band of 1850 MHz to 1910 MHz and a reception frequency band of 1930 MHz to 1990 MHz, and the like.

The high-frequency power amplifier module RFMD2 includes the high-frequency power amplifier circuits HPA1 and HPA2, the control block CTLBK, and the directional couplers (couplers) CPL1 and CPL2, like the RFMD1 in FIG. 1. The HPA1 performs power amplification by receiving the transmission high-frequency signal RFin_H for the high band of the GSM that is output via the transmission mixer circuit in the RFIC2, and the HPA2 performs power amplification by receiving the transmission high-frequency signal RFin_L for the low band of the GSM that is output via the transmission mixer circuit in the RFIC2. The CPL1 and the CPL2 detect power levels of the transmission power signals from the HPA1 and the HPA2, respectively, and generate the power detection voltage VDET which has a voltage corresponding to a size of the power level. The VDET is input to the control block CTLBK unlike the case in FIG. 1.

Unlike the case in FIG. 1, the control block CTLBK includes what is called an APC (Automatic Power Control) circuit. The APC compares between a power indication signal VRAMP that is input from the baseband unit BBU via the high-frequency signal processing device RFIC2, and the power detection voltage VDET described above, and controls gains of the high-frequency power amplifier circuits HPA1 and HPA2 so that an error of a comparison result is reduced. In the GSM, because a constant envelope modulation such as GMSK (Gaussian filtered Minimum Shift Keying) is used, the HPA1 and the HPA2 may perform non-linear amplification. Therefore, the APC circuit can control the transmission power by controlling the HPA1 and the HPA2, as illustrated in FIG. 21.

Further, because the antenna switch ANTSW in FIG. 21 is a TDD (Time Division Duplex) system which is different from a FDD (Frequency Division Duplex) system in FIG. 1, the antenna switch ANTSW is configured to select any one of a transmission path of the high band, a reception path of the high band, a transmission path of the low band, and a reception path of the low band, as a connection path of the antenna. The transmission power signal from the high-frequency power amplifier circuit HPA1 is transmitted to the antenna ANT as the transmission signal TX via the ANTSW, and conversely, the reception signal RX received by the ANT is output to the SAW filter SAW1 as the reception signal RX_H via the ANTSW. Similarly, the transmission power signal from the high-frequency power amplifier circuit HPA2 is transmitted to the antenna ANT as the TX via the ANTSW, and conversely, the RX received by the ANT is output to the SAW filter SAW2 as the reception signal RX_L via the ANTSW.

As described above, the gains of the high-frequency power amplifier circuits HPA1 and HPA2 are controlled on the basis of the APC circuit in the control block CTLBK, and the CTLBK controls the gain by appropriately controlling the bias of the HPA1 and the HPA2. At this time, the APC circuit controls the bias by amplifying the error between the power indication signal VRAMP and the power detection voltage VDET, for example, on the basis of a predetermined reference voltage (reference current). Therefore, in order to perform the bias control with high accuracy in the control range of the APC circuit, it is preferable that the reference voltage (reference current) is highly accurate relative to the target value. Consequently, the use of the correction system described in each embodiment is beneficial.

The invention carried out by the present inventor has been described above in detail on the basis of the embodiments. However, the present invention is not limited to the above embodiments, and various modifications can be made without departing from the spirit of the invention.

For example, the reference-voltage correction circuit VREFCTL1 in FIG. 4, has been achieved by the amplifier circuit having a differential pair of NMOS transistors, the current mirror circuit by PMOS transistors, and the like. However, depending on the case, the reference-voltage correction circuit VREFCTL1 can be also realized by the amplifier circuit having a differential pair of PMOS transistors, the current mirror circuit by NMOS transistors, and the like.

AMP amplifier circuit
ANT antenna
ANTSW antenna switch
AR mounting area
BBU baseband unit
BF unity gain buffer
BGR bandgap reference circuit
BS bias circuit
BSWBK band switch block
BW bonding wire
CMP comparator circuit
CMPBK comparator circuit block
CPD internal electrode (internal pad)
CPL directional coupler (coupler)
CTLBK control block
CTLIC control chip
DEC decoder circuit
DPX duplexer
EN band selection signal
FS fuse
GND ground power supply voltage
HB high-band selection signal
HPA high-frequency power amplifier circuit
HPAIC high-frequency power amplifier chip
HPW high-power mode selection signal
IREFCTL reference-current generation and correction circuit
IS current source
ISB bias current source
L coil
LB low-band selection signal
LPF low-pass filter
LPW low-power mode selection signal
MIC microphone
MN NMOS transistor
MNT matching circuit
MP PMOS transistor
MPW middle-power mode selection signal
PA power amplifier circuit
PD electrode (pad)
PMD power mode selection signal
PMDCTL power mode control circuit
PN external terminal
PSD shutdown signal
PSWBK power switch block
Q bipolar transistor
R resistor
REF terminal
RFIC high-frequency signal processing device
RFMD high-frequency power amplifier module
RFSYS high-frequency system unit
RFin high-frequency input signal
RFout high-frequency output signal
SAW SAW filter
SD·BDCTL shutdown band control circuit
SPK speaker
SS ON/OFF control signal
SW switch
SWBK switch block
SWCTL switch control circuit
TMPCP temperature correction circuit
TRM high-harmonic termination circuit
TX transmission signal
VBAT power supply voltage
VCBK power supply block
VCC supply voltage
VCNT bias control signal
VDET power detection voltage
VOUT output voltage terminal
VREFCTL reference-voltage correction circuit
VREG regulator circuit
Vbg bandgap voltage
Vcp comparison voltage
Vref reference voltage

What is claimed is:

1. A semiconductor integrated circuit device comprising:
a reference-voltage generating circuit configured to generate a first reference voltage;
a reference-voltage correction circuit supplied with the first reference voltage and configured to generate a second reference voltage obtained by correcting the first reference voltage; and
a regulator circuit including a first amplifier circuit of a negative feedback configuration and a feedback resistor, and configured to generate a predetermined output voltage according to the second reference voltage and a resistance value of the feedback resistor, wherein
the reference-voltage correction circuit includes:
a buffer circuit supplied with the first reference voltage, and configured to output a first voltage with a potential approximately equal to that of the first reference voltage and perform impedance conversion between an input and an output;
a first resistor configured to generate a first current having a current value according to a voltage value of the first voltage;
a first node supplied with a second current having a current value proportional to the current value of the first current; and
first, second, and third resistance paths selectively coupled between the first node and a first power supply voltage and having mutually different resistance values, and
the second reference voltage is generated in the first node on the basis of a resistance value associated with any one resistance path selected from among the first, second, and third resistance paths and the current value of the second current.

2. The semiconductor integrated circuit device according to claim 1, wherein
the buffer circuit includes:
a second amplifier circuit having a first input node supplied with the first reference voltage; and
a first transistor configured to be controlled by an output of the second amplifier circuit, one end of the first transistor being coupled to a second input node of the second amplifier circuit and to the first resistor, and
the second current is supplied to the first node via a second transistor current-mirror connected to the first transistor.

3. The semiconductor integrated circuit device according to claim 2, wherein
the semiconductor integrated circuit device is realized by one semiconductor chip,
the semiconductor chip further includes first, second, and third terminals,
the first resistance path is realized by a first resistor coupled between the first node and the first terminal,
the second resistance path is realized by a second resistor coupled between the first node and the second terminal,
the third resistance path is realized by a third resistor coupled between the first node and the third terminal, and
selection of the first, second, and third resistance paths is realized by connecting any one of the first, second, and third terminals, via a bonding wire, to a supply area of the first power supply voltage provided outside the semiconductor chip.

4. The semiconductor integrated circuit device according to claim 3, wherein the semiconductor chip further includes:
a fourth terminal;
a first switch and a fourth resistor coupled in series between an output node of the regulator circuit and the fourth terminal; and
a second switch and a fifth resistor coupled in series between the output node of the regulator circuit and the fourth terminal and coupled in parallel to the first switch and the fourth resistor, and
the fourth terminal is configured to be used for setting a bias of a power amplifier transistor.

5. The semiconductor integrated circuit device according to claim 2, wherein
the reference-voltage generating circuit is a bandgap reference circuit.

6. The semiconductor integrated circuit device according to claim 2, wherein
the semiconductor integrated circuit device is configured by one semiconductor chip,
the semiconductor chip further includes first, second, and third terminals,
the first resistance path is realized by a first resistor coupled between the first node and the first terminal,
the second resistance path is realized by a second resistor coupled between the first node and the second terminal,
the third resistance path is realized by a third resistor coupled between the first node and the third terminal, and
selection of the first, second, and third resistance paths is realized by connecting any one of the first, second, and third terminals, via a bonding wire, to a supply terminal of the first power supply voltage provided inside the semiconductor chip.

7. The semiconductor integrated circuit device according to claim 2, wherein
the semiconductor integrated circuit device is configured by one semiconductor chip,
the semiconductor chip includes fifth and sixth terminals,
the first resistance path is realized by a sixth resistor coupled between the first node and the fifth terminal,
the second and third resistance paths are realized by:
seventh and eighth resistors coupled in series between the first node and the sixth terminal; and
a fuse coupled in parallel to the eighth resistor,
selection of the first resistance path is realized by connecting the fifth terminal, via a bonding wire, to a supply terminal of the first power supply voltage provided inside or outside the semiconductor chip,
selection of the second resistance path is realized by connecting the sixth terminal, via a bonding wire, to a supply terminal of the first power supply voltage provided inside or outside the semiconductor chip, and
selection of the third resistance path is realized by connecting the sixth terminal, via a bonding wire, to a supply terminal of the first power supply voltage provided inside or outside the semiconductor chip, and also by disconnecting the fuse.

8. A semiconductor integrated circuit device comprising:
a reference-voltage generating circuit configured to generate a first reference voltage;
a first amplifier circuit having a first input node supplied with the first reference voltage;
a first transistor configured to be controlled by an output of the first amplifier circuit, one end of the first transistor being coupled to a second input node of the first amplifier circuit;
first, second, and third resistance paths selectively coupled between the second input node and a first power supply voltage, and having mutually different resistance values; and
a second transistor current-mirror connected to the first transistor.

9. The semiconductor integrated circuit device according to claim 8, wherein
the semiconductor integrated circuit device is realized by one semiconductor chip,
the semiconductor chip further includes first, second, and third terminals,
the first resistance path is realized by a first resistor coupled between the second input node and the first terminal,
the second resistance path is realized by a second resistor coupled between the second input node and the second terminal,
the third resistance path is realized by a third resistor coupled between the second input node and the third terminal, and
selection of the first, second, and third resistance paths is realized by connecting any one of the first, second, and third terminals, via a bonding wire, to a supply area of the first power supply voltage provided outside the semiconductor chip.

10. The semiconductor integrated circuit device according to claim 9, wherein
a current flowing in the second transistor sets a bias of a power amplifier transistor.

11. The semiconductor integrated circuit device according to claim 9, wherein
the reference-voltage generating circuit is a bandgap reference circuit.

12. The semiconductor integrated circuit device according to claim 9, wherein
the semiconductor integrated circuit device is realized by one semiconductor chip,
the semiconductor chip further includes first, second, and third terminals,
the first resistance path is realized by a first resistor coupled between the second input node and the first terminal,
the second resistance path is realized by a second resistor coupled between the second input node and the second terminal,
the third resistance path is realized by a third resistor coupled between the second input node and the third terminal, and
selection of the first, second, and third resistance paths is realized by connecting any one of the first, second, and third terminals, via a bonding wire, to a supply terminal of the first power supply voltage provided inside the semiconductor chip.

13. A high-frequency power amplifier module comprising a module wiring substrate on which one or more semiconductor chips are mounted, wherein
on the one or more semiconductor chips, there are formed:
a plurality of power amplifier transistors; and
a control block configured to supply a bias to the plurality of power amplifier transistors,
the control block includes:
a reference-voltage generating circuit configured to generate a first reference voltage;
a reference-voltage correction circuit supplied with the first reference voltage and configured to generate a second reference voltage obtained by correcting the first reference voltage; and
a regulator circuit including a first amplifier circuit of a negative feedback configuration and a feedback resistor, and configured to generate a predetermined output voltage according to the second reference voltage and a resistance value of the feedback resistor,
the reference-voltage correction circuit includes:
a buffer circuit supplied with the first reference voltage, and configured to output a first voltage with a potential approximately equal to that of the first reference voltage and perform impedance conversion between an input and an output;
a first resistor configured to generate a first current having a current value according to a voltage value of the first voltage;
a first node supplied with a second current having a current value proportional to the current value of the first current; and
first, second, and third resistance paths selectively coupled between the first node and a first power supply voltage and that have mutually different resistance values,
the second reference voltage is generated in the first node on the basis of a resistance value associated with any one resistance path selected from among the first, second, and third resistance paths and the current value of the second current, and
biases of the plurality of power amplifier transistors are determined according to an output voltage of the regulator circuit.

14. The high-frequency power amplifier module according to claim 13, wherein
the buffer circuit includes:
a second amplifier circuit having a first input node supplied with the first reference voltage; and
a first transistor configured to be controlled by an output of the second amplifier circuit, and one end of the first transistor being coupled to a second input node of the second amplifier circuit and to the first resistor, and
the second current is supplied to the first node via a second transistor current-mirror connected to the first transistor.

15. The high-frequency power amplifier module according to claim 14, wherein
the one or more semiconductor chips further include first, second, and third terminals,
the first resistance path is realized by a first resistor coupled between the first node and the first terminal,
the second resistance path is realized by a second resistor coupled between the first node and the second terminal,
the third resistance path is realized by a third resistor coupled between the first node and the third terminal, and
selection of the first, second, and third resistance paths is realized by connecting any one of the first, second, and third terminals, via a bonding wire, to a supply area of the first power supply voltage provided on the module wiring substrate.

16. The high-frequency power amplifier module according to claim 14, wherein
the one or more semiconductor chips further include:
a second node;
a first switch and a fourth resistor coupled in series between an output node of the regulator circuit and the second node; and
a second switch and a fifth resistor coupled in series between the output node of the regulator circuit and the second node, and coupled in parallel to the first switch and the fourth resistor, and
biases of the plurality of power amplifier transistors are supplied from the second node.

17. The high-frequency power amplifier module according to claim 14, wherein
the reference-voltage generating circuit is a bandgap reference circuit.

18. The high-frequency power amplifier module according to claim 14, wherein
the one or more semiconductor chips further include first, second, and third terminals,
the first resistance path is realized by a first resistor coupled between the first node and the first terminal,
the second resistance path is realized by a second resistor coupled between the first node and the second terminal,
the third resistance path is realized by a third resistor coupled between the first node and the third terminal, and
selection of the first, second, and third resistance paths is realized by connecting any one of the first, second, and third terminals, via a bonding wire, to a supply terminal of the first power supply voltage provided inside the one or more semiconductor chips.

* * * * *

UNITED STATES PATENT AND TRADEMARK OFFICE
CERTIFICATE OF CORRECTION

PATENT NO. : 9,166,531 B2  
APPLICATION NO. : 14/366719  
DATED : October 20, 2015  
INVENTOR(S) : Masanori Iijima Page 1 of 1

It is certified that error appears in the above-identified patent and that said Letters Patent is hereby corrected as shown below:

In the specification,

Column 10, line 25, please replace "Rd." with -- Rr1. --

Column 24, lines 13-14, please add
    -- RX    reception signal -- after
    "RFout   high-freqency input signal" and before
    "SAW   SAW filter"

Signed and Sealed this
Eighth Day of March, 2016

Michelle K. Lee
*Director of the United States Patent and Trademark Office*